(12) United States Patent
Yu et al.

(10) Patent No.: US 11,380,653 B2
(45) Date of Patent: Jul. 5, 2022

(54) DIE STACK STRUCTURE AND MANUFACTURING METHOD THEREOF

(71) Applicant: Taiwan Semiconductor Manufacturing Co., Ltd., Hsinchu (TW)

(72) Inventors: Chen-Hua Yu, Hsinchu (TW);
Hsien-Wei Chen, Hsinchu (TW);
Ming-Fa Chen, Taichung (TW);
Sung-Feng Yeh, Taipei (TW);
Tzuan-Horng Liu, Taoyuan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/903,370

(22) Filed: Jun. 16, 2020

(65) Prior Publication Data

US 2021/0066254 A1  Mar. 4, 2021

Related U.S. Application Data

(60) Provisional application No. 62/892,536, filed on Aug. 27, 2019.

(51) Int. Cl.
| | |
|---|---|
| H01L 25/065 | (2006.01) |
| H01L 23/538 | (2006.01) |
| H01L 21/768 | (2006.01) |
| H01L 23/31 | (2006.01) |
| H01L 21/56 | (2006.01) |

(52) U.S. Cl.
CPC .......... *H01L 25/0657* (2013.01); *H01L 21/56* (2013.01); *H01L 21/76802* (2013.01); *H01L 23/31* (2013.01); *H01L 23/5384* (2013.01); *H01L 23/5385* (2013.01); *H01L 23/5386* (2013.01)

(58) Field of Classification Search
CPC ... H01L 25/0657; H01L 25/105; H01L 21/56; H01L 21/76802; H01L 23/31; H01L 23/5384; H01L 23/5385; H01L 23/5386; H01L 23/13
USPC ......................................................... 257/774
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |

(Continued)

*Primary Examiner* — Dao H Nguyen
(74) *Attorney, Agent, or Firm* — JCIPRNET

(57) ABSTRACT

A die stack structure including a first die, an encapsulant, a redistribution layer and a second die is provided. The encapsulant laterally encapsulates the first die. The redistribution layer is disposed below the encapsulant, and electrically connected with the first die. The second die is disposed between the redistribution layer and the first die, wherein the first and second dies are electrically connected with each other, the second die comprises a body portion having a first side surface, a second side surface and a curved side surface therebetween, and the curved side surface connects the first side surface and the second side surface.

20 Claims, 27 Drawing Sheets

(56) References Cited

U.S. PATENT DOCUMENTS

| | | |
|---|---|---|
| 9,666,502 B2 | 5/2017 | Chen et al. |
| 9,735,131 B2 | 8/2017 | Su et al. |
| 11,056,432 B2* | 7/2021 | Lee .................... H01L 25/0657 |
| 2006/0175697 A1* | 8/2006 | Kurosawa ............. H01L 23/481 |
| | | 257/686 |
| 2008/0315407 A1* | 12/2008 | Andrews, Jr. ........ G01R 1/0483 |
| | | 257/735 |
| 2013/0157414 A1* | 6/2013 | Ho ...................... H01L 29/0657 |
| | | 438/113 |
| 2019/0067248 A1* | 2/2019 | Yoo .................... H01L 21/6835 |
| 2020/0020641 A1* | 1/2020 | Ko .................... H01L 23/3107 |

* cited by examiner

DIE STACK STRUCTURE AND MANUFACTURING METHOD THEREOF

CROSS-REFERENCE TO RELATED APPLICATION

This application claims the priority benefit of U.S. provisional application Ser. No. 62/892,536, filed on Aug. 27, 2019. The entirety of the above-mentioned patent application is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies. Currently, System-on-Integrated-Circuit (SoIC) components are becoming increasingly popular for their multi-functions and compactness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
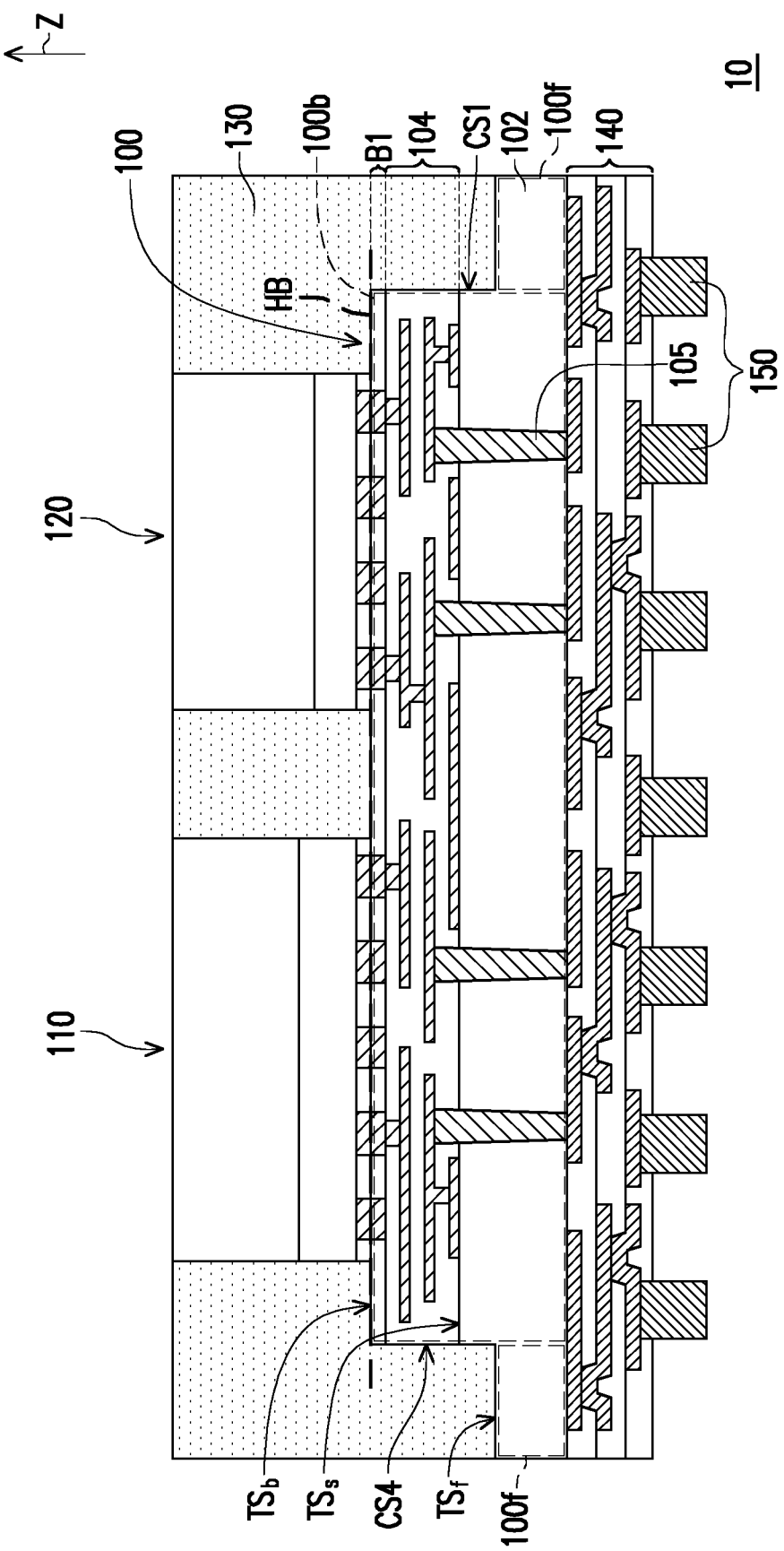
FIG. 1 is a schematic cross-sectional view of a die stack structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2:
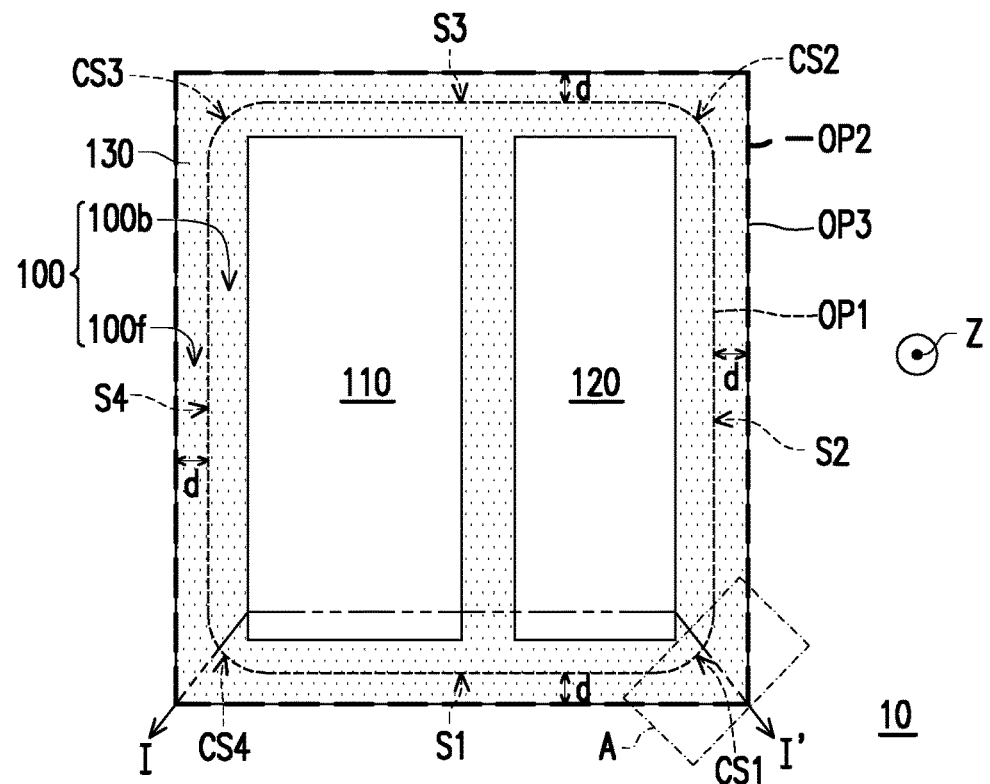
FIG. 2 is a schematic top view of a die stack structure in accordance with some embodiments of the present disclosure.
Figure 3:
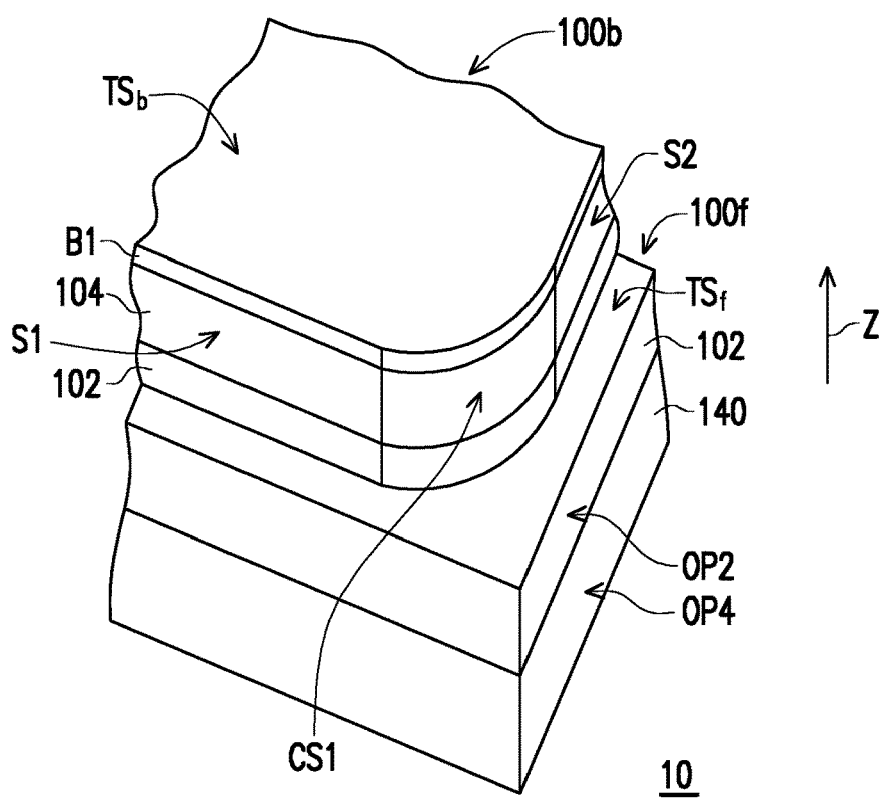
FIG. 3 is a schematic perspective view of a portion of a die stack structure in accordance with some embodiments of the present disclosure.

FIG. 1 is a schematic cross-sectional view of a die stack structure in accordance with some embodiments of the disclosure. FIG. 2 is a schematic top view of a die stack structure in accordance with some embodiments of the disclosure. FIG. 3 is a schematic perspective view of a portion of a die stack structure in accordance with some embodiments of the disclosure. Specifically, FIG. 1 is a cross-sectional view taken along the line I-I' of FIG. 2, and FIG. 3 is an enlarged perspective view of the dashed area A outlined in FIG. 2. For simplicity and clarity of illustration, only few elements such as first to third dies and an encapsulant are shown in the simplified top view of FIG. 2, and these elements are not necessarily in the same plane. And, it should be noted that an encapsulant is omitted in FIG. 3 for simplicity and clarity of illustration.

Referring to FIG. 1, FIG. 2 and FIG. 3, a die stack structure 10 includes a first die 100, a second die 110, a third die 120, an encapsulant 130, and a redistribution layer 140. Since multiple dies (i.e., the first die 100, the second die 110, and the third die 120) are integrated into a single die stack structure 10, the die stack structure 10 may be referred to as a "system of integrated chips (SoIC) package." In some embodiments, the die stack structure 10 may further include conductive terminals 150. In some embodiments, referring to FIG. 1, FIG. 2 and FIG. 3, the first die 100 may include a body portion 100b and a flange portion 100f exceeding the body portion 100b. In some embodiments, the body portion 100b is covered and surrounded by the flange portion 100f. In some embodiments, the illustrated top surface $TS_f$ of the flange portion 100f is lower than the illustrated top surface $TS_b$ of the body portion 100b. That is to say, a portion of the body portion 100b protrudes from the flange portion 100f along a direction Z parallel to a thickness direction of the die stack structure 10, as shown in FIG. 1 and FIG. 3. In other words, a portion of the body portion 100b is uncovered by the flange portion 100f. From another point of view, as shown in FIG. 1 and FIG. 3, the body portion 100b and the flange portion 100f collectively define a staircase shaped structure. That is to say, the first die 100 has a stepped profile.

Further, referring to FIG. 1, FIG. 2 and FIG. 3, the body portion 100b uncovered by the flange portion 100f has a first side surface S1, a second side surface S2, a third side surface S3, a fourth side surface S4, a first curved side surface CS1, a second curved side surface CS2, a third curved side surface CS3, a fourth curved side surface CS4. In some embodiments, the first curved side surface CS1 is located between the first side surface S1 and the second side surface S2, the second curved side surface CS2 is located between the second side surface S2 and the third side surface S3, the third curved side surface CS3 is located between the third side surface S3 and the fourth side surface S4, and the fourth curved side surface CS4 is located between the fourth side surface S4 and the first side surface S1. In some embodiments, the first curved side surface CS1 connects the first side surface S1 and the second side surface S2, the second curved side surface CS2 connects the second side surface S2 and the third side surface S3, the third curved side surface CS3 connects the third side surface S3 and the fourth side surface S4, and the fourth curved side surface CS4 connects the fourth side surface S4 and the first side surface S1. As shown in FIG. 2, from the top view, the body portion 100b may have an outer profile OP1 that exhibits a rounded corner rectangle shape. That is to say, from the top view, the corners of the body portion 100b uncovered by the flange portion 100f are not sharp and are occupied by the first curved side surface CS1, the second curved side surface CS2, the third curved side surface CS3 and the fourth curved side surface CS4. In other words, from the top view, the body portion 100b uncovered by the flange portion 100f are free of sharp corners. It is noted that the term "sharp" refers to angles of 90° or less throughout the entire disclosure. On the other hand, the term "sharp corner" refers to corners having angles of 90° or less throughout the entire disclosure. In some embodiments, an arc of each of the first curved side surface CS1, the second curved side surface CS2, the third curved side surface CS3 and the fourth curved side surface CS4 ranges between about 0.78 radian (45 degree) and about 1.57 radian (90 degree).

In some embodiments, as shown in FIG. 2, from the top view, the flange portion 100f may have an outer profile OP2 that exhibits a rectangle shape. That is to say, from the top view, the outer profile OP2 of the flange portion 100f has sharp corners. Moreover, in some embodiments, the flange portion 100f has an inner profile opposite to the outer profile OP2, and the inner profile of the flange portion 100f may be vertically aligned with the outer profile OP1 of the body portion 100b. That is to say, the inner profile of the flange portion 100f may not be laterally offset from the outer profile OP1 of the body portion 100b. In addition, as shown in FIG. 2, from the top view, the dimension d of the flange portion 100f between the outer profile OP2 and the inner profile of the flange portion 100f corresponding to the first side surface S1, the second side surface S2, the third side surface S3, or the fourth side surface S4 may be in a range from about 1 μm to about 1 mm. In some embodiments, the dimension d of the flange portion 100f is in a range from about 1 μm to about 80 μm.

In some embodiments, as shown in FIG. 1, the first die 100 may include a semiconductor substrate 102, an interconnect structure 104 disposed on the semiconductor substrate 102, through semiconductor vias 105 embedded in the semiconductor substrate 102 and the interconnect structure 104, and a bonding structure B1 disposed on the interconnect structure 104. In some embodiments, as shown in FIG. 1 and FIG. 3, the body portion 100b is constituted by the bonding structure B1, the interconnect structure 104, the through semiconductor vias 105 and the semiconductor substrate 102 located right under the interconnect structure 104, and the flange portion 100f is constituted by the semiconductor substrate 102 exceeding the interconnect structure 104. That is to say, a portion of the semiconductor substrate 102 belongs to the body portion 100b, and another portion of the semiconductor substrate 102 belongs to the flange portion 100f. Further, as shown in FIG. 1, the illustrated top surface of the semiconductor substrate 102 in the flange portion 100f (i.e., the illustrated top surface $TS_f$ of the flange portion 100f) is lower than the illustrated top surface $TS_s$ of the semiconductor substrate 102 in the body portion 100b (i.e., the interface between the interconnect structure 104 and the semiconductor substrate 102). As such, the portion of the body portion 100b protruding from the flange portion 100f along the direction Z may be constituted by the bonding structure B1, the interconnect structure 104, portions of the through semiconductor vias 105 and a portion of the semiconductor substrate 102. Accordingly, from the top view, each of the bonding structure B1, the interconnect structure 104 and the semiconductor substrate 102 may have an outer profile that exhibits a rounded corner rectangle shape. That is to say, each of the bonding structure B1, the interconnect structure 104 and the semiconductor substrate 102 may have curved side surfaces. For example, as shown in FIG. 3, the bonding structure B1, the interconnect structure 104, and the semiconductor substrate 102 may have curved side surfaces collectively referred to as the first curved side surface CS1. Although FIG. 3 only illustrates a portion of the die stack structure 10 corresponding to the first curved side surface CS1, according to the descriptions with respect to FIG. 1, FIG. 2 and FIG. 3 above, those skilled in the art should understand that the bonding structure B1, the interconnect structure 104, and the semiconductor substrate 102 may have curved side surfaces collectively referred to as the second curved side surface CS2, the bonding structure B1, the interconnect structure 104, and the semiconductor substrate 102 may have curved side surfaces collectively referred to as the third curved side surface CS3, and the bonding structure B1, the interconnect structure 104, and the semiconductor substrate 102 may have curved side surfaces collectively referred to as the fourth curved side surface CS4. In other words, each of the bonding structure B1, the interconnect structure 104, and the semiconductor substrate 102 may have four curved side surfaces corresponding to the first curved side surface CS1, the second curved side surface CS2, the third curved side surface CS3 and the fourth curved side surface CS4.

In some embodiments, the second die 110 and the third die 120 are stacked on the first die 100 along the direction Z and electrically connected with the first die 100. The second die 110 is laterally separated from the third die 120. In some embodiments, the second die 110 and the third die 120 are hybrid-bonded with the first die 100. As such, a hybrid bonding interface HB (represented by the dash line in FIG. 1) is located between the second die 110 and the first die 100 and between the third die 120 and the first die 100.

In some embodiments, the encapsulant 130 laterally encapsulates the second die 110 and the third die 120. In some embodiments, as shown in FIG. 1 and FIG. 2, the encapsulant 130 further covers the first die 100 and contacts the first curved side surface CS1, the second curved side surface CS2, the third curved side surface CS3 and the fourth curved side surface CS4 of the first die 100. That is to say, the body portion 100b uncovered by the flange portion 100f is covered by the encapsulant 130. As mentioned above, the corners of the body portion 100b uncovered by the flange portion 100f are not sharp and are occupied by the first curved side surface CS1, the second curved side surface CS2, the third curved side surface CS3 and the fourth curved side surface CS4. As such, even stress is induced in the die stack structure 10 at least because of coefficient of thermal expansion (CTE) mismatch between the encapsulant 130 and the first die 100, issues including crack and/or delamination originated from sharp corners can be eliminated. In detail, the non-sharp corners of the first die 100 aids releasing stress resulted from CTE mismatch between the encapsulant 130 and the first die 100, thereby suppressing the crack and/or delamination prone to occur at fragile material in the first die 100. In some embodiments, as shown in FIG. 2, from the top view, the outer profile OP3 of the encapsulant 130 is vertically aligned with the outer profile OP2 of the flange portion 100f. That is to say, from the top view, the outer profile OP3 of the encapsulant 130 exhibits a rectangle shape with sharp corners. In other words, the outer profile OP3 of the encapsulant 130 is not laterally offset from the outer profile OP2 of the flange portion 100f.

In some embodiments, the redistribution layer 140 is located below the encapsulant 130. As shown in FIG. 1 and FIG. 3, the first die 100 is disposed between the redistribution layer 140 and the second die 110, and between the redistribution layer 140 and the third die 120. In some embodiments, the redistribution layer 140 is electrically connected with the first die 100. It should be noted that because the outer profile OP4 of the redistribution layer 140 is vertically aligned with the outer profile OP2 of the flange portion 100f, the redistribution layer 140 right under the first die 100 is omitted in the top view of FIG. 2. And, according to the descriptions with respect to FIG. 1, FIG. 2 and FIG. 3 above, those skilled in the art should understand that the outer profile OP4 of the redistribution layer 140 exhibits a rectangle shape with sharp corners from the top view. In some embodiments, the conductive terminals 150 are electrically connected with the redistribution layer 140.

The features of the die stack structure 10 will be discussed in further detail below in conjunction with FIG. 4A to FIG. 4F and FIG. 5. FIG. 4A to FIG. 4F are schematic cross-sectional views of various stages in a manufacturing method of the die stack structure 10 in accordance with some embodiments of the present disclosure. FIG. 5 is a schematic top view illustrating the semiconductor wafer in the stage of FIG. 4B in accordance with some embodiments of the present disclosure. Specifically, FIG. 4B is a cross-sectional view taken along the line II-II' of FIG. 5. It should be noted that bonding pads of a bonding structure are omitted in FIG. 5 for simplicity and clarity of illustration. The elements similar to or substantially the same as the elements described previously will use the same reference numbers, and certain details or descriptions (e.g. the materials, formation processes, positioning configurations, etc.) of the same elements would not be repeated herein.

Figure 4A:
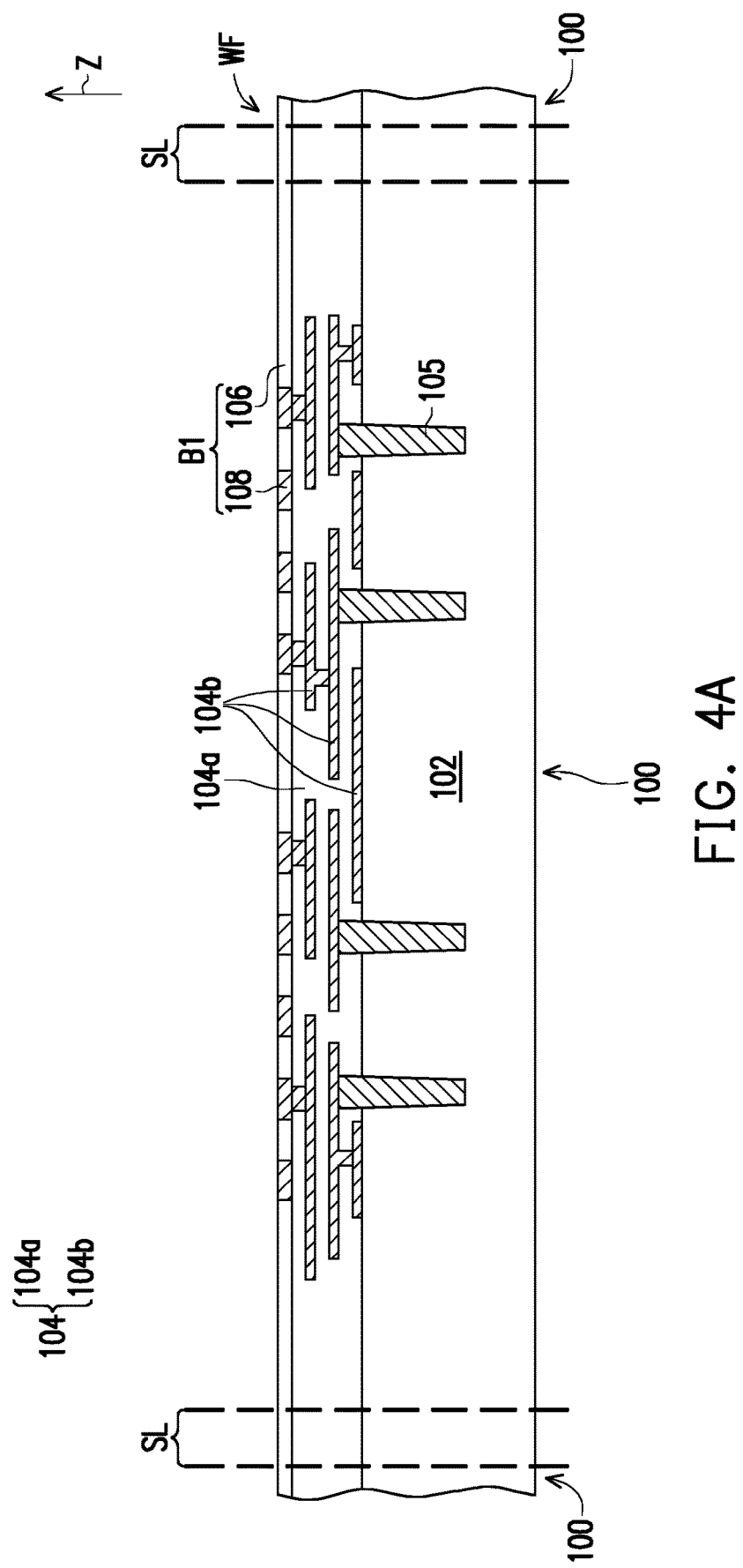
FIG. 4A to FIG. 4F are schematic cross-sectional views of various stages in a method of manufacturing a die stack structure in accordance with some embodiments of the present disclosure.
Figure 4B:
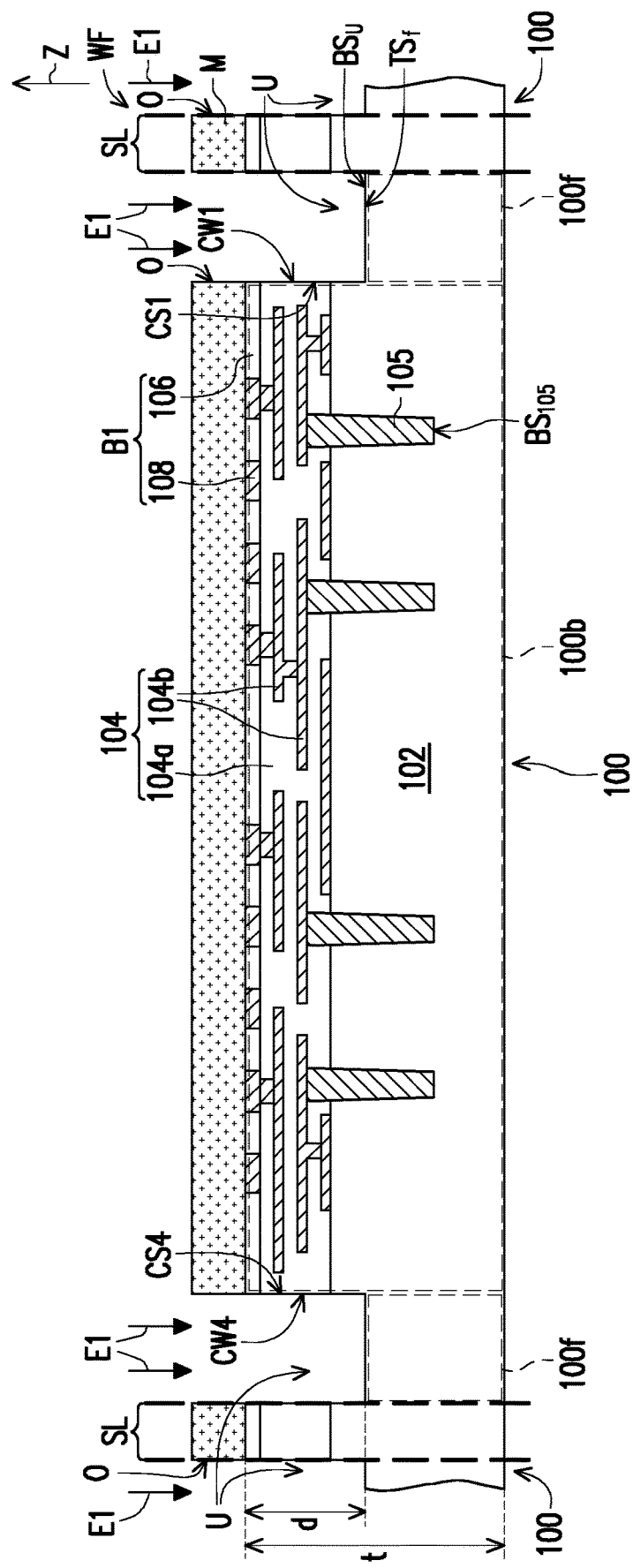
Figure 5:
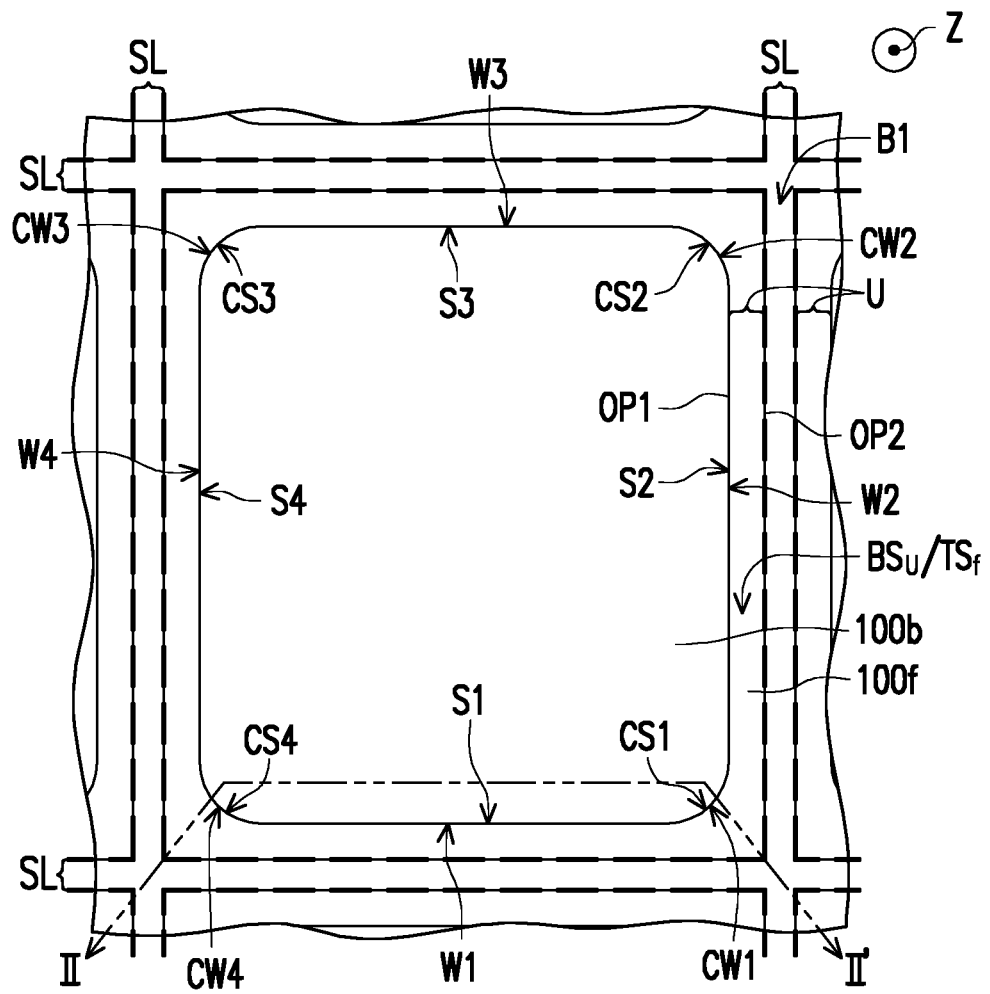
FIG. 5 is a schematic top view illustrating the semiconductor wafer in the stage of FIG. 4B in accordance with some embodiments of the present disclosure.

Referring to FIG. 4A, a semiconductor wafer WF having a plurality of first dies 100 arranged in array is provided, wherein the first dies 100 are defined by intersected scribe lanes SL (represented by the dash line in FIG. 4A). In some embodiments, the first die 100 may include a memory chip such as a high bandwidth memory chip, a dynamic random access memory (DRAM) chip or a static random access memory (SRAM) chip. In some alternative embodiments, the first die 100 may include a logic chip (e.g., central processing unit (CPU), graphics processing unit (GPU), system-on-a-chip (SoC), application processor (AP), microcontroller, etc.), an application-specific integrated circuit (ASIC) chip, an analog chip, a sensor chip, a wireless application chip (e.g., a Bluetooth chip, a radio frequency chip, etc.), or a voltage regulator chip. In one embodiment, the first die 100 includes a DRAM chip or a CPU chip.

As illustrated in FIG. 4A, each of the first dies 100 includes a semiconductor substrate 102, a interconnect structure 104, through semiconductor vias 105 and a bonding structure B1. In some embodiments, the semiconductor substrate 102 may be made of elemental semiconductor materials such as crystalline silicon, diamond, or germanium; compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In some embodiments, the semiconductor substrate 102 may be a bulk semiconductor material. For example, the semiconductor substrate 102 may be a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof. However, the disclosure is not limited thereto. In some alternative embodiments, the semiconductor substrate 102 may include active components (e.g., transistors and/or memories such as NMOS and/or PMOS devices, or the like) and optionally passive components (e.g., resistors, capacitors, inductors or the like) formed therein.

In some embodiments, the interconnect structure 104 is disposed on the semiconductor substrate 102. In certain embodiments, the interconnect structure 104 is electrically connected with the active components and/or the passive components formed in the semiconductor substrate 102. In some embodiments, the interconnect structure 104 includes an inter-dielectric layer 104a and a plurality of conductive layers 104b. In some embodiments, the conductive layers 104b are embedded in the inter-dielectric layer 104a. For simplicity, the inter-dielectric layer 104a is illustrated as a bulky layer in FIG. 4A, but it should be understood that the inter-dielectric layer 104a may be constituted by multiple dielectric layers, and the number of the dielectric layers in the inter-dielectric layer 104a may be adjusted depending on product requirement. Further, the conductive layers 104b and the dielectric layers of the inter-dielectric layer 104a may be stacked alternately. It should be noted that the number of the conductive layers 104b shown in FIG. 4A is merely an illustration, and the disclosure is not limited. In some alternative embodiments, the number of the conductive layers 104b may be adjusted based on product requirement.

In some embodiments, the inter-dielectric layer 104a may be made of fragile material. In some embodiments, the fragile material may include a low-k dielectric material having a k-value of less than about 3. For example, the inter-dielectric layer 104a may be made of a low-k dielectric material having a k-value of less than about 2.5, and hence is sometimes referred to as an extra low-k (ELK) dielectric layer. In some embodiments, examples of the low-k dielectric material may include hydrogen silsesquioxane (HSQ), porous HSQ, methyl silsesquioxane (MSQ), porous MSQ, NANOGLASS®, hybrid-organo siloxane polymer (HOSP), CORAL®, AURORA®, BLACK DIAMOND®, Xerogel, Aerogel, amorphous fluorinated carbon, Parylene, BCB, FLARE®, SILK®, SiOF, or the like. In some embodiments, the inter-dielectric layer 104a may be formed by suitable fabrication techniques such as spin-on coating, chemical vapor deposition (CVD), High-Density Plasma Chemical Vapor Deposition (HDPCVD) or plasma-enhanced chemical vapor deposition (PECVD). In some embodiments, the conductive layers 104b may be made of copper or other suitable metal. In some embodiments, the conductive layers 104b may be formed by suitable fabrication techniques such as electroplating or deposition. In certain embodiments, the conductive layers 104b may be formed by dual-damascene process. In alternative embodiments, the conductive layers 104b may be formed by multiple single damascene processes.

In some embodiments, the through semiconductor vias 105 are located in the semiconductor substrate 102 and the interconnect structure 104. In some embodiments, the through semiconductor vias 105 are electrically connected with the conductive layers 104b of the interconnect structure 104. As illustrated in FIG. 4A, the through semiconductor vias 105 are embedded in the semiconductor substrate 102 and the interconnect structure 104, and the through semiconductor vias 105 are not revealed from the illustrated bottom surface of the semiconductor substrate 102. In some embodiments, the through semiconductor via 105 may be referred to as through silicon via.

In some embodiments, the bonding structure B1 is located on the interconnect structure 104. In some embodiments, the bonding structure B1 includes a bonding film 106 and bonding pads 108 located in the bonding film 106. As illustrated in FIG. 4A, the bonding pads 108 penetrate through the bonding film 106. In some embodiments, the bonding film 106 may be made of silicon oxide ($SiO_x$, where x>0), silicon oxynitride ($SiO_xN_y$, where x>0 and y>0), silicon nitride ($SiN_x$, where x>0), or other suitable dielectric material. In some embodiments, the bonding film 106 may be formed by suitable fabrication techniques such as CVD, HDPCVD or PECVD. In some embodiments, the bonding pads 108 may be made of copper or other suitable metal that is easy for forming hybrid bonding. In some embodiments, the bonding pads 108 may be formed by suitable fabrication techniques such as electroplating or deposition. In certain embodiments, the bonding pads 108 may be formed by a damascene process, such as a single damascene process. The number of the bonding pads 108 may be less than or more than what is depicted in FIG. 4A, and may be designated based on the demand and/or design layout; the disclosure is not specifically limited thereto. In some embodiments, the illustrated top surfaces of the bonding pads 108 and the bonding film 106 are substantially coplanar so as to provide an appropriate surface for hybrid bonding. The planarity may be achieved, for example, through a planarization step such as a chemical mechanical polishing (CMP) step or a mechanical grinding step.

Referring to both of FIG. 4B and FIG. 5, a trench forming process is performed on the semiconductor wafer WF to form at least one ring-shaped trench U. As shown in FIG. 4B and FIG. 5, the ring-shaped trench U is formed beside the intersected scribe lanes SL and within the span of the first die 100. In some embodiments, the ring-shaped trench U is formed to extend laterally along the intersected scribe lanes SL in a closed path. In FIG. 4B, one complete ring-shaped trench U is shown for simplicity. Based on the description of FIG. 4A mentioned above, those skilled in the art should understand that multiple ring-shaped trenches U arranged in array and corresponding to the first dies 100 are formed during the trench forming process. As shown in FIG. 5, the outer profile OP2 of the ring-shaped trench U is overlapped with the edges of the intersected scribe lanes SL. Due to such configuration, the multiple ring-shaped trenches U formed during the trench forming process are separated by the intersected scribe lanes SL. In detail, as shown in FIG. 4B, the multiple ring-shaped trenches U are spaced apart from one other by the semiconductor substrate 102, the interconnect structure 104 and the bonding structure B1 located within the intersected scribe lanes SL.

In some embodiments, the trench forming process may include the steps of providing a mask M with openings O on the bonding structure B1, and performing an anisotropic etching E1 to remove portions of the first dies 100 that are not covered by the mask M to form the ring-shaped trenches U corresponding to the openings O. As mentioned above, during the trench forming process, the multiple ring-shaped trenches U arranged in array and corresponding to the first dies 100 are formed, and thus those skilled in the art can understand that the mask M utilized by the trench forming process includes multiple openings O arranged in array and corresponding to the multiple ring-shaped trenches U. That is to say, the multiple openings O in the mask M each have a ring shape. In addition, as mentioned above, the multiple ring-shaped trenches U formed in the first dies 100 are separated from one another, thereby the multiple openings O in the mask M are separated from one another. As shown in FIG. 4B, the mask M completely covers the illustrated top surface of the bonding structure B1 located within the intersected scribe lanes SL. That is to say, during the trench forming process, the bonding structure B1, the interconnect structure 104 and the semiconductor substrate 102 located within the intersected scribe lanes SL substantially are not etched. In other words, the ring-shaped trenches U are not extended into the intersected scribe lanes SL. However, the disclosure is not limited thereto. In alternative embodiments, the illustrated top surface of the bonding structure B1 located within the intersected scribe lanes SL is partially covered by the mask M. That is to say, during the trench forming process, the bonding structure B1, the interconnect structure 104 and the semiconductor substrate 102 located within the intersected scribe lanes SL may be partially etched. In yet alternative embodiments, the illustrated top surface of the bonding structure B1 located within the intersected scribe lanes SL is not covered by the mask M. In such case, the multiple ring-shaped trenches U in the semiconductor wafer WF communicate with one another to render a grid pattern. In some embodiments, the mask M is a patterned resist layer. In some embodiments, the anisotropic etching E1 is a dry etching. In some embodiments, the anisotropic etching E1 is a plasma dicing process (e.g., bosch process).

In some embodiments, as shown in FIG. 4B and FIG. 5, during the trench forming process, portions of the bonding structure B1, the interconnect structure 104 and the semiconductor substrate 102 are removed to render a flange portion 100f located right under the ring-shaped trench U and a body portion 100b laterally surrounded by the ring-shaped trench U and the flange portion 100f. As such, inner sidewalls of the ring-shaped trench U are defined by the body portion 100b, and a bottom surface of the ring-shaped trench U is defined by the flange portion 100f. That is to say, the ring-shaped trench U is at least partially defined by the body portion 100b and the flange portion 100f.

In detail, referring to FIG. 4B and FIG. 5, the ring-shaped trench U has a first inner sidewall W1, a second inner sidewall W2, a third inner sidewall W3, a fourth inner sidewall W4, a first curved inner sidewall CW1, a second curved inner sidewall CW2, a third curved inner sidewall CW3, a fourth curved inner sidewall CW4. In some embodiments, the first curved inner sidewall CW1 is located between the first inner sidewall W1 and the second inner sidewall W2, the second curved inner sidewall CW2 is located between the second inner sidewall W2 and the third inner sidewall W3, the third curved inner sidewall CW3 is located between the third inner sidewall W3 and the fourth inner sidewall W4, and the fourth curved inner sidewall CW4 is located between the fourth inner sidewall W4 and the first inner sidewall W1. In some embodiments, the first curved inner sidewall CW1 connects the first inner sidewall W1 and the second inner sidewall W2, the second curved inner sidewall CW2 connects the second inner sidewall W2 and the third inner sidewall W3, the third curved inner sidewall CW3 connects the third inner sidewall W3 and the fourth inner sidewall W4, and the fourth curved inner sidewall CW4 connects the fourth inner sidewall W4 and the first inner sidewall W1.

As mentioned above, the inner sidewalls of the ring-shaped trench U are defined by the body portion 100b, thereby the body portion 100b may have a first side surface S1, a second side surface S2, a third side surface S3, a fourth side surface S4, a first curved side surface CS1, a second curved side surface CS2, a third curved side surface CS3, a fourth curved side surface CS4 respectively corresponding to the first inner sidewall W1, the second inner sidewall W2, the third inner sidewall W3, the fourth inner sidewall W4, the first curved inner sidewall CW1, the second curved inner sidewall CW2, the third curved inner sidewall CW3, the fourth curved inner sidewall CW4. As shown in FIG. 5, from the top view, an outer profile OP1 constituted by the first side surface S1, the second side surface S2, the third side surface S3, the fourth side surface S4, the first curved side surface CS1, the second curved side surface CS2, the third curved side surface CS3, the fourth curved side surface CS4 of the body portion 100b exhibits a rounded corner rectangle shape. That is to say, by forming the ring-shaped trench U, the body portion 100b having the non-sharp corners which are occupied by the first curved side surface CS1, the second curved side surface CS2, the third curved side surface CS3 and the fourth curved side surface CS4 is accordingly formed. In some embodiments, the first side surface S1, the second side surface S2, the third side surface S3, the fourth side surface S4, the first curved side surface CS1, the second curved side surface CS2, the third curved side surface CS3, the fourth curved side surface CS4 of the body portion 100b are exposed by the ring-shaped trench U.

In some embodiments, referring to FIG. 4B and FIG. 5, the bottom surface $BS_U$ of the ring-shaped trench U is higher than the bottom surfaces $BS_{105}$ of the through semiconductor vias 105. As mentioned above, the ring-shaped trench U is located right above the flange portion 100f, and the bottom surface $BS_U$ of the ring-shaped trench U is defined by the flange portion 100f, so that the top surface $TS_f$ of the flange portion 100f is accordingly higher than the bottom surfaces $BS_{105}$ of the through semiconductor vias 105, and is exposed by the ring-shaped trench U.

In some embodiments, the ring-shaped trench U does not penetrate through the first die 100. That is to say, in a direction Z parallel to a normal direction of the semiconductor wafer WF, the depth d of the ring-shaped trench U is less than the thickness t of the first die 100. Further, as shown in FIG. 4B, the trench forming process etches through the interconnect structure 104 and etches into the semiconductor substrate 102 to form the ring-shaped trench U. In other words, the ring-shaped trench U extends vertically through the bonding structure B1 to the interconnect structure 104 and further extends vertically through the interconnect structure 104 to the semiconductor substrate 102 along the direction Z. In view of this, since the ring-shaped trench U does not penetrate through the first die 100, the first inner sidewall W1, the second inner sidewall W2, the third inner sidewall W3, the fourth inner sidewall W4, the first curved inner sidewall CW1, the second curved inner sidewall CW2, the third curved inner sidewall CW3, the fourth curved inner sidewall CW4 of the ring-shaped trench U are defined by the bonding structure B1, the interconnect structure 104 and the semiconductor substrate 102, and the bottom surface $BS_U$ of the ring-shaped trench U is defined by the semiconductor substrate 102. Accordingly, from the top view, each of the bonding structure B1, the interconnect structure 104 and the semiconductor substrate 102 may have an outer profile identical to the outer profile OP1 of the body portion 100b. That is to say, during trench forming process, the bonding structure B1, the interconnect structure 104 and the semiconductor substrate 102 are etched to render the first die 100 with non-sharp corners. From another point of view, since the flange portion 100f is located right under the ring-shaped trench U, and the body portion 100b is laterally surrounded by the ring-shaped trench U and the flange portion 100f, the flange portion 100f is constituted by the semiconductor substrate 102 located right under the ring-shaped trench U, and the body portion 100b is constituted by the bonding structure B1, the interconnect structure 104, the semiconductor substrate 102 located right under the interconnect structure 104 and the through semiconductor vias 105 embedded in the semiconductor substrate 102 located right under the interconnect structure 104.

Figure 4C:
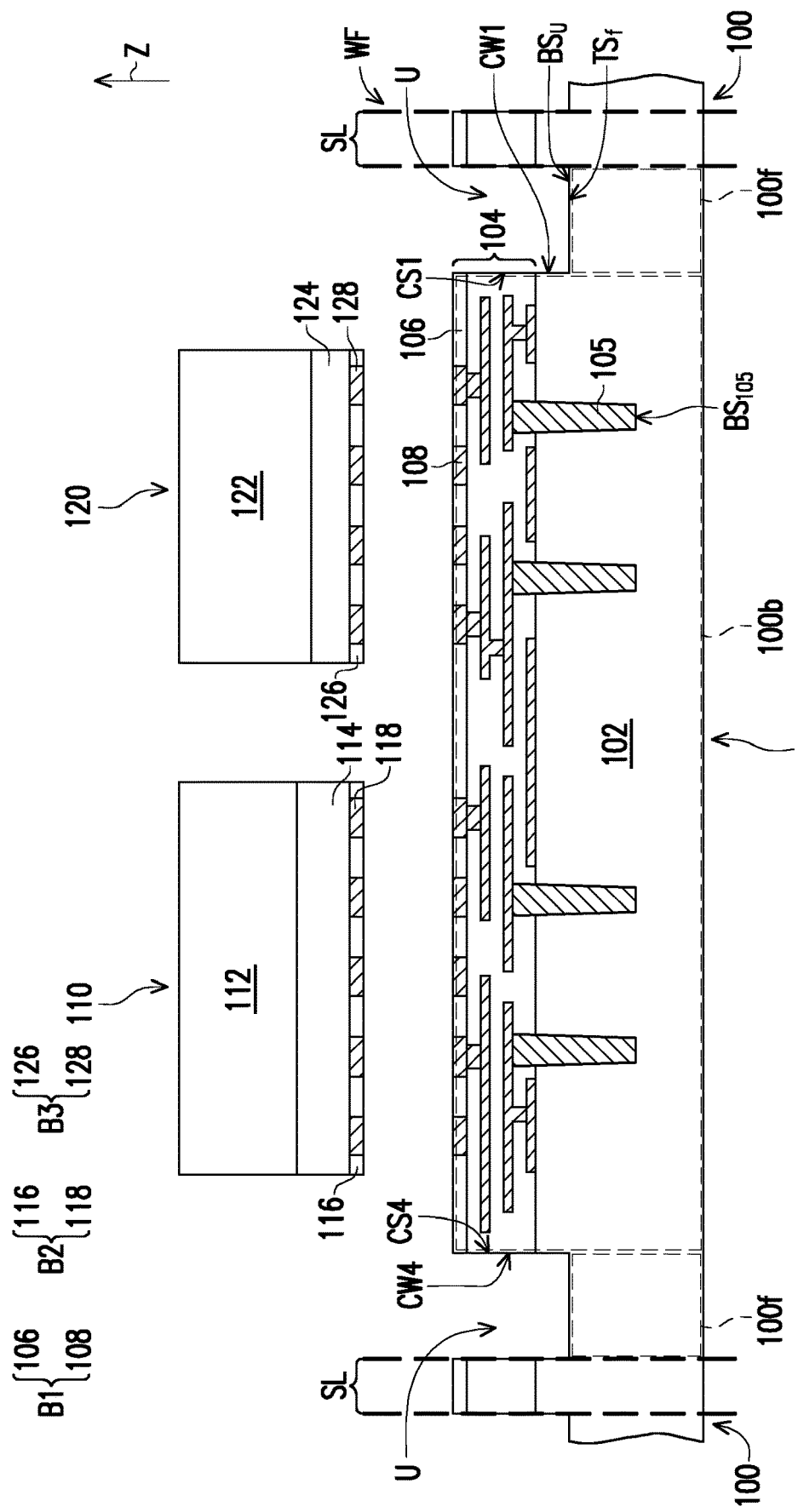

Referring to FIG. 4C, after removing the mask M, a second die 110 and a third die 120 are provided and placed on the first die 100. The second die 110 and the third die 120 are disposed side-by side on the bonding structure B1 of the first die 100. Although FIG. 4C illustrates that two dies (i.e., the second die 110 and the third die 120) are placed on the first die 100, it should be noted that the number of the dies placed on the first die 100 is not limited thereto, and this can be adjusted based on design requirement. Also, it is understood that the number of the second or third die may be less than or more than what is depicted in FIG. 4C, and may be designated based on the design requirement. In some embodiments, the second die 110 and the third die 120 have different functions and properties. It is appreciated that dies diced from different semiconductor wafers may have different properties and functions. Accordingly, in some embodiments that the second die 110 and the third die 120 have different functions, the second die 110 and the third die 120 are singulated from different semiconductor wafers. In some alternative embodiments, the second die 110 and the third die 120 have the same function, and are singulated from the same semiconductor wafer. In some embodiments, the second die 110 or the third die 120 may include a memory chip such as a high bandwidth memory chip, a dynamic random access memory (DRAM) chip or a static random access memory (SRAM) chip. In some alternative embodiments, the second die 110 or the third die 120 may include a logic chip (e.g., central processing unit (CPU), graphics processing unit (GPU), system-on-a-chip (SoC), application processor (AP), microcontroller, etc.), an application-specific integrated circuit (ASIC) chip, an analog chip, a sensor chip, a wireless application chip (e.g., a Bluetooth chip, a radio frequency chip, etc.), or a voltage regulator chip. In one embodiment, the second die 110 includes a CPU chip, and the third die 120 includes an SRAM chip. Furthermore, in some embodiments, the second die 110 and the third die 120 may be in different sizes (e.g., different heights and/or surface areas). In some alternative embodiments, the second die 110 and the third die 120 may be in the same size (e.g., same heights and/or surface areas).

In some embodiments, the second die 110 may include a semiconductor substrate 112, a interconnect structure 114 and a bonding structure B2. In some embodiments, the semiconductor substrate 112 may be made of elemental semiconductor materials such as crystalline silicon, diamond, or germanium; compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In some embodiments, the semiconductor substrate 112 may include active components (e.g., transistors or the like) and/or passive components (e.g., resistors, capacitors, inductors, or the like) formed therein. In some embodiments, the interconnect structure 114 is used for connecting to the active components (not shown) and/or the passive components (not shown) in the semiconductor substrate 112. In some embodiments, the interconnect structure 114 may include metal lines and vias (not shown).

In some embodiments, the bonding structure B2 includes a bonding film 116 and bonding pads 118 located in the bonding film 116. As illustrated in FIG. 4C, the bonding pads 118 penetrate through the bonding film 116. In some embodiments, the bonding film 116 may be made of silicon oxide ($SiO_x$, where x>0), silicon oxynitride ($SiO_xN_y$, where x>0 and y>0), silicon nitride ($SiN_x$, where x>0), or other suitable dielectric material. In some embodiments, the bonding film 116 may be formed by suitable fabrication techniques such as CVD, HDPCVD or PECVD. In some embodiments, the bonding pads 118 may be made of copper or other suitable metal that is easy for forming hybrid bonding. In some embodiments, the bonding pads 118 may be formed by suitable fabrication techniques such as electroplating or deposition. In certain embodiments, the bonding pads 118 may be formed by a damascene process, such as a single damascene process. The number of the bonding pads 118 may be less than or more than what is depicted in FIG. 4C, and may be designated based on the demand and/or design layout; the disclosure is not specifically limited thereto. In some embodiments, the illustrated bottom surfaces of the bonding pads 118 and the bonding film 116 are substantially coplanar so as to provide an appropriate surface for hybrid bonding. The planarity may be achieved, for example, through a planarization step such as a CMP step or a mechanical grinding step. In some embodiments, the second die 110 may be a thinned die that has been subjected to a thinning down process from the backside to a desirable thickness. In some embodiments, the thinning down process of the second die 110 may include a polishing process, an etching process or a combination thereof.

In some embodiments, the third die 120 may include a semiconductor substrate 122, a interconnect structure 124, and a bonding structure B3. In some embodiments, the semiconductor substrate 122 may be made of elemental semiconductor materials such as crystalline silicon, diamond, or germanium; compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In some embodiments, the semiconductor substrate 122 may include active components (e.g., transistors or the like) and/or passive components (e.g., resistors, capacitors, inductors, or the like) formed therein. In some embodiments, the interconnect structure 124 is used for connecting to the active components (not shown) and/or the passive components (not shown) in the semiconductor substrate 122. In some embodiments, the interconnect structure 124 may include metal lines and vias (not shown).

In some embodiments, the bonding structure B3 includes a bonding film 126 and bonding pads 128 located in the bonding film 126. As illustrated in FIG. 4C, the bonding pads 128 penetrate through the bonding film 126. In some embodiments, the bonding film 126 may be made of silicon oxide ($SiO_x$, where x>0), silicon oxynitride ($SiO_xN_y$, where x>0 and y>0), silicon nitride ($SiN_x$, where x>0), or other suitable dielectric material. In some embodiments, the bonding film 126 may be formed by suitable fabrication techniques such as CVD, HDPCVD or PECVD. In some embodiments, the bonding pads 128 may be made of copper or other suitable metal that is easy for forming hybrid bonding. In some embodiments, the bonding pads 128 may be formed by suitable fabrication techniques such as electroplating or deposition. In certain embodiments, the bonding pads 128 may be formed by a damascene process, such as a single damascene process. The number of the bonding pads 128 may be less than or more than what is depicted in FIG. 4C, and may be designated based on the demand and/or design layout; the disclosure is not specifically limited thereto. In some embodiments, the illustrated bottom surfaces of the bonding pads 128 and the bonding film 126 are substantially coplanar so as to provide an appropriate surface for hybrid bonding. The planarity may be achieved, for example, through a planarization step such as a CMP step or a mechanical grinding step. In some embodiments, the third die 120 may be a thinned die that has been subjected to a thinning down process from the backside to a desirable thickness. In some embodiments, the thinning down process of the third die 120 may include a polishing process, an etching process or a combination thereof.

Although not expressly shown in FIG. 4C, the second die 110 and the third die 120 may be placed on the illustrated top surface (e.g., front side) of the first die 100 such that the illustrated top surface of the first die 100 is in contact with the illustrated bottom surface (e.g., front side) of the second die 110 and the illustrated bottom surface (e.g., front side) of the third die 120. Meanwhile, the bonding pads 118 of the second die 110 and the bonding pads 128 of the third die 120 are substantially aligned and in direct contact with the bonding pads 108 of the first die 100.

Figure 4D:
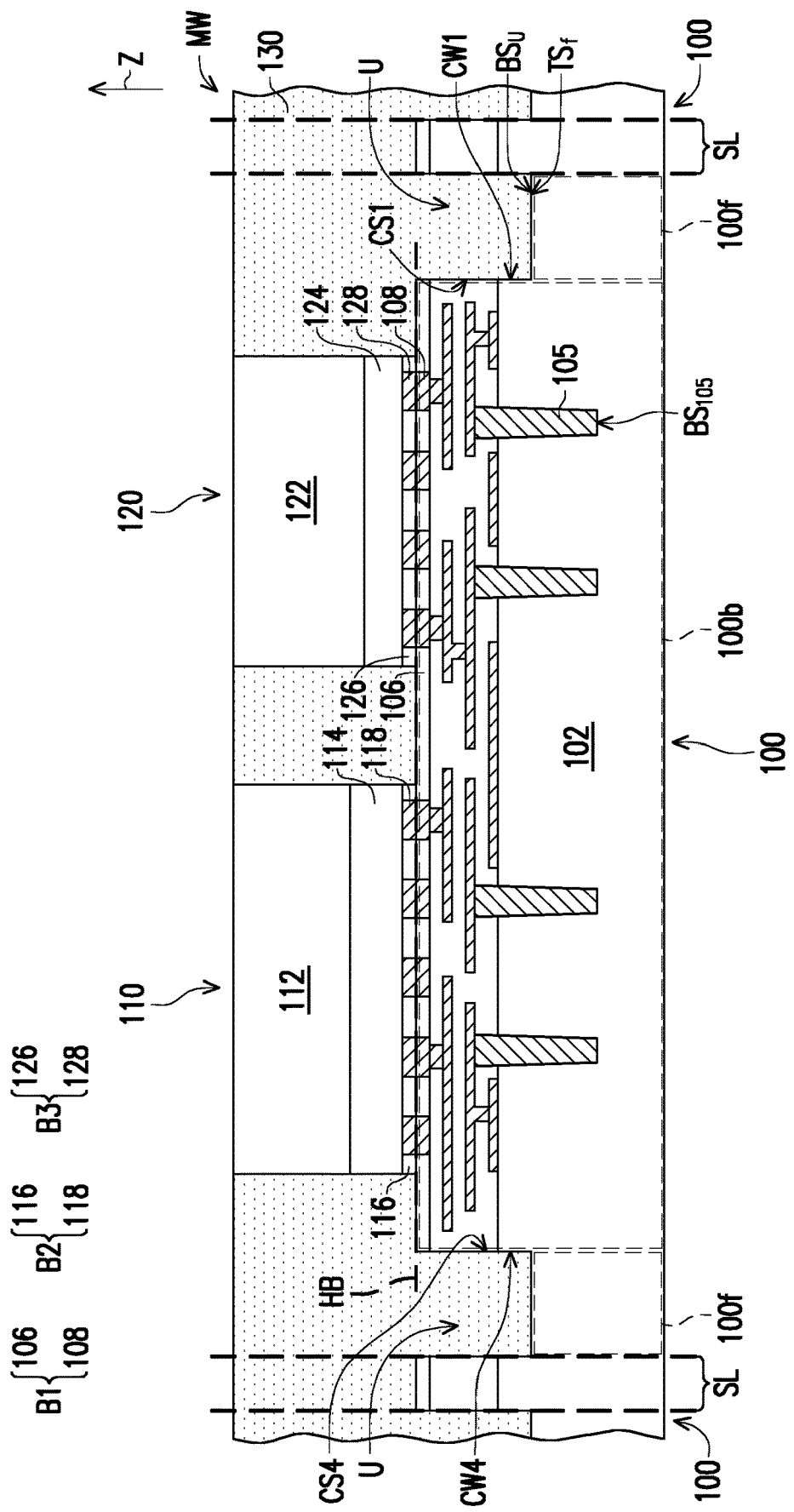

Referring to FIG. 4D, after the second die 110 and the third die 120 are placed on the first die 100, a bonding process is performed to bond the second die 110 and the third die 120 with the first die 100. As shown in FIG. 4C, the second die 110 and the first die 100 are face-to-face bonded together by the bonding structure B1 and the bonding structure B2, and the third die 120 and the first die 100 are face-to-face bonded together by the bonding structure B1 and the bonding structure B3. In detail, as shown in FIG. 4C, the bonding film 116 of the bonding structure B2 is bonded to the bonding film 106 of the bonding structure B1 through the dielectric-to-dielectric bonding, and the bonding pads 118 of the bonding structure B2 are bonded to the bonding pads 108 of the bonding structure B1 through the metal-to-metal bonding. Also, as shown in FIG. 4C, the bonding film 126 of the bonding structure B3 is bonded to the bonding film 106 of the bonding structure B1 through the dielectric-to-dielectric bonding, and the bonding pads 128 of the bonding structure B3 are bonded to the bonding pads 108 of the bonding structure B1 through the metal-to-metal bonding. That is to say, during the bonding process, the second die 110 and the third die 120 both are hybrid bonded to the first die 100, and a hybrid bonding interface HB (represented by the dash line in FIG. 4C) is achieved between the second die 110 and the first die 100 and between the third die 120 and the first die 100. In other words, the bonding process is a hybrid bonding process. In some embodiments, the second die 110 is electrically connected to the first die 100 by the bonding structure B2 and the bonding structure B1, and the third die 120 is electrically connected to the first die 100 by the bonding structure B3 and the bonding structure B1. In some embodiments, the metal-to-metal bonding at the hybrid bonding interface HB is copper-to-copper bonding. In some embodiments, the dielectric-to-dielectric bonding at the hybrid bonding interface HB is achieved with Si—O—Si bonds generated. In some embodiments, the second die 110 and third die 120 both are hybrid bonded to the first die 100 through chip-to-wafer bonding technology.

In some embodiments, during the bonding process, a low temperature heating process at a temperature of about 100° C. to about 300° C. is performed to strengthen the dielectric-to-dielectric bonding at the hybrid bonding interface HB, and a high temperature heating process is performed at a temperature of about 200° C. to about 400° C. to facilitate the metal-to-metal bonding at the hybrid bonding interface HB. In some embodiments, bonding the second die 110 to the first die 100 and bonding the third die 120 to the first die 100 may be performed in the same bonding process. However, the disclosure is not limited thereto. In some alternative embodiments, bonding the second die 110 to the first die 100 and bonding the third die 120 to the first die 100 may be performed in separate bonding processes. In some embodiments, to facilitate the hybrid bonding between the second die 110 and the first die 100 and the hybrid bonding between the third die 120 and the first die 100, surface preparation for the bonding surfaces of the second die 110, the third die 120 and the first die 100 may be performed. The surface preparation may include surface cleaning and activation, for example. In some embodiments, the bonding surfaces of the second die 110, the third die 120 and the first die 100 may be cleaned by wet cleaning, for example.

Optionally, in some embodiments, the second die 110 or the third die 120 may be thinned down from the backside to a desirable thickness if the second die 110 or the third die 120 is not a thinned die. In some embodiments, the thinning down process of the second die 110 or the third die 120 may include a polishing process, an etching process or a combination thereof.

Continued on FIG. 4D, an encapsulant 130 is formed over the semiconductor wafer WF to form a molded wafer MW. In some embodiments, the encapsulant 130 at least laterally encapsulates the second die 110 and the third die 120. As shown in FIG. 4D, the encapsulant 130 is formed to fill the gap between the second die 110 and the third die 120 and wrap around the sidewalls of the second die 110 and the third die 120. In some embodiments, the encapsulant 130 may be referred to as "gap-fill material". In some embodiments, the encapsulant 130 further extends and fills into the ring-shaped trench U to cover the first die 100. Although not expressly shown in FIG. 4D, according to the descriptions with respect to FIG. 4B and FIG. 5 above, those skilled in the art should understand that as the encapsulant 130 fills the ring-shaped trench U, the encapsulant 130 contacts the first side surface S1, the second side surface S2, the third side surface S3, the fourth side surface S4, the first curved side surface CS1, the second curved side surface CS2, the third curved side surface CS3, the fourth curved side surface CS4 of the body portion 100b which respectively correspond to the first inner sidewall W1, the second inner sidewall W2, the third inner sidewall W3, the fourth inner sidewall W4, the first curved inner sidewall CW1, the second curved inner sidewall CW2, the third curved inner sidewall CW3, the fourth curved inner sidewall CW4 of the ring-shaped trench U, and the top surface $TS_f$ of the flange portion 100f which corresponds to the bottom surface $BS_U$ of the ring-shaped trench U accordingly.

In some embodiments, the method of forming the encapsulant 130 may include the following steps: forming an encapsulant material on the semiconductor wafer WF by an over-molding process or a film deposition process; and then performing a planarization process to expose the illustrated top surfaces of the second die 110 and the third die 120. In some embodiments, the over-molding process is a compression molding process, for example. In some embodiments, the film deposition process may include CVD, HDPCVD, PECVD, atomic layer deposition (ALD), or combinations thereof. In some embodiments, the planarization process may include a mechanical grinding process, a CMP process, or combinations thereof. In some embodiments, the encapsulant 130 may include a molding compound, a molding underfill, a resin (such as epoxy resin), or the like. In some alternative embodiments, the encapsulant 130 may include silicon oxide ($SiO_x$, where x>0), silicon oxynitride ($SiO_xN_y$, where x>0 and y>0), silicon nitride ($SiN_x$, where x>0), or other suitable dielectric material. In some embodiments, the encapsulant 130 may include a base material (e.g., a polymer, a resin or the like) and filler particles (e.g., silica, clay or the like) distributed in the base material.

As mentioned above, the non-sharp corners of the first die 100 aids releasing stress resulted from CTE mismatch between the encapsulant 130 and the first die 100. As such, by rendering the non-sharp corners to the first die 100 during the trench forming process, even stress is induced in the subsequently formed die stack structure 10 because of CTE mismatch between the encapsulant 130 and the first die 100, issues including crack and/or delamination originated from sharp corners can be eliminated. Further, since during the trench forming process, the ring-shaped trench U penetrate through the interconnect structure 104 to render it with the non-sharp corners, even stress is induced in the subsequently formed die stack structure 10 because of CTE mismatch between the encapsulant 130 and the first die 100, the crack and/or delamination prone to occur at the fragile material in the interconnect structure 104 can effectively be suppressed. As a result, the negative effects originated from sharp corners may be sufficiently eliminated, thereby ensuring the performance and efficiency of the subsequently formed device.

Figure 4E:
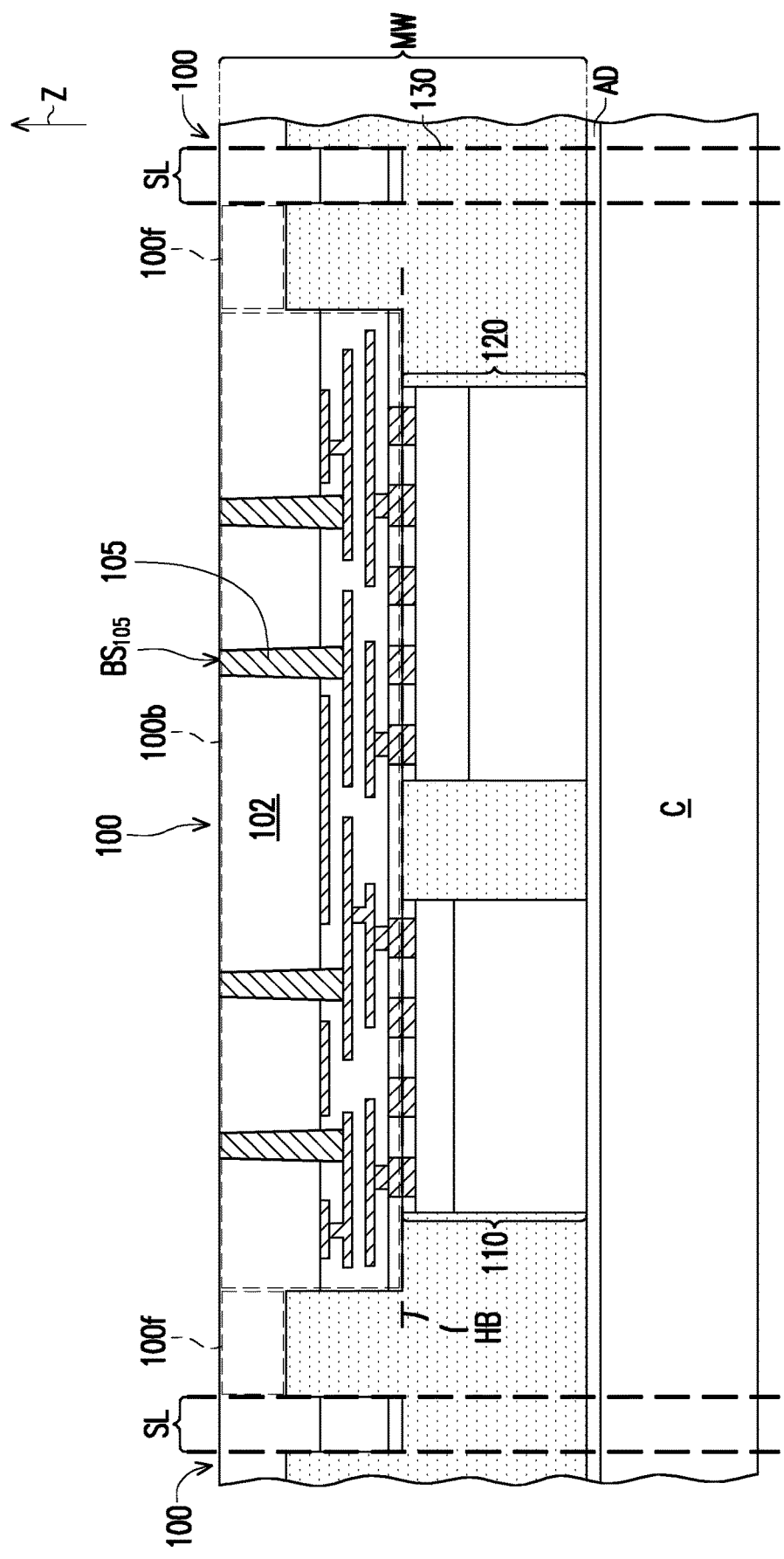

Referring to FIG. 4E, after the molded wafer MW is formed, a carrier C is provided and bonded on the second die 110, the third die 120 and the encapsulant 130. In some embodiments, the carrier C is boned to the second die 110, the third die 120 and the encapsulant 130 through an adhesive layer AD, as shown in FIG. 4E. In some embodiments, the adhesive layer AD may include a die attach film (DAF). However, the disclosure is not limited thereto. In some alternative embodiments, other materials may be adapted as the adhesive layer AD as long as the said material is able to strengthen the adhesion between the carrier C and the second die 110, the adhesion between the carrier C and the third die 120, and the adhesion between the carrier C and the encapsulant 130. In certain embodiments, the carrier C is a glass carrier.

Figure 4F:
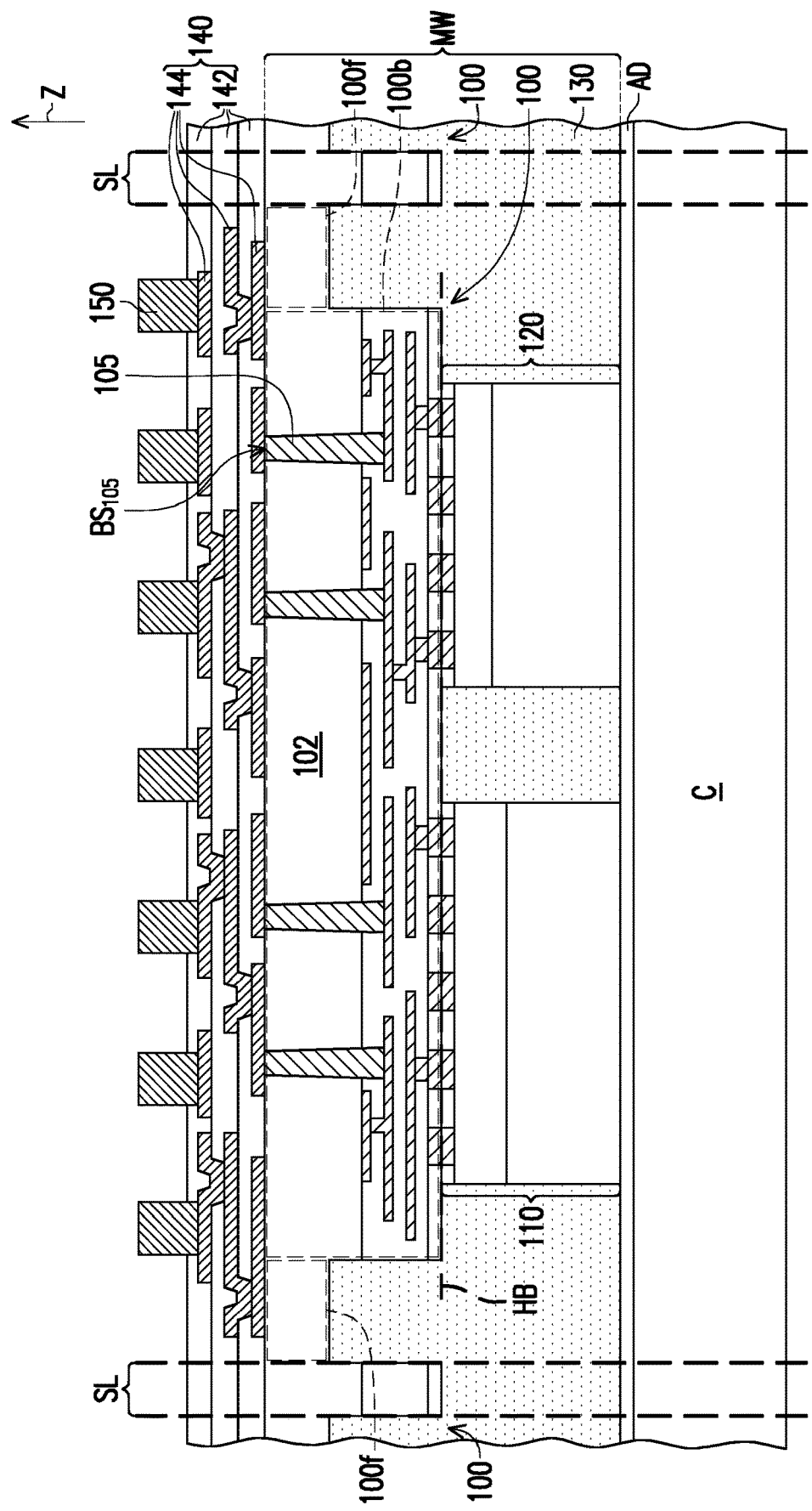

Continued on FIG. 4E, after the carrier C is bonded to the molded wafer MW, the resulted structure is flipped (turned upside down). Subsequently, the molded wafer MW is thinned down from the backside until the through semiconductor vias 105 are revealed through a thinning down process. In some embodiments, as shown in FIG. 4D, during the thinning down process, the body portion 100f and the flange portion 100f of the semiconductor substrate 102 is thinned or partially removed to reveal the bottom surfaces $S_{105}$ (i.e., the illustrated top surfaces in FIG. 4D) of the through semiconductor vias 105. Since in the molded wafer MW shown in FIG. 4D, the top surface $TS_f$ of the flange portion 100f is higher than the bottom surfaces $S_{105}$ of the through semiconductor vias 105, after the molded wafer MW is turned upside down as shown in FIG. 4E, the top surface $TS_f$ (i.e., the illustrated bottom surface in FIG. 4E) of the flange portion 100f is lower than the bottom surface $S_{105}$ (i.e., the illustrated top surface in FIG. 4E) of the through semiconductor vias 105. Accordingly, during the thinning down process, the bottom surfaces $S_{105}$ (i.e., the illustrated top surfaces in FIG. 4D) of the through semiconductor vias 105 are revealed, while the flange portion 100f still remains. In some embodiments, after the thinning down process, the bottom surfaces $S_{105}$ (i.e., the illustrated top surfaces in FIG. 4D) of the through semiconductor vias 105 are substantially flush or coplanar with the illustrated top surface of the thinned semiconductor substrate 102. In some embodiments, the through semiconductor vias 105 penetrate through the thinned semiconductor substrate 102 for dual-side connection (as shown in FIG. 4F). In some embodiments, the thinning down process may include a polishing process, an etching process or a combination thereof.

Referring to FIG. 4F, after the thinning down process, a redistribution layer 140 and conductive terminals 150 are sequentially formed on the thinned molded wafer MW. In some embodiments, as shown in FIG. 4F, the redistribution layer 140 is formed to directly contact the bottom surfaces $S_{105}$ (i.e., the illustrated top surfaces in FIG. 4F) of the through semiconductor vias 105 and the illustrated top surface of the semiconductor substrate 102. That is, the first die 100 is located between the redistribution layer 140 and the second die 110. In some embodiments, the redistribution layer 140 is electrically connected to the first die 100 through the through semiconductor vias 105. In some embodiments, the redistribution layer 140 may be referred as a back-side redistribution layer, which provides a routing function for the first die 100, the second die 110 and the third die 120.

Furthermore, in some embodiments, the formation of the redistribution layer 140 includes sequentially forming one or more dielectric layers 142, and one or more conductive layers 144 in alternation. In certain embodiments, as shown in FIG. 4F, the conductive layers 144 are sandwiched between the dielectric layers 142, but the illustrated top surface of the topmost layer of the conductive layers 144 is exposed by the topmost layer of the dielectric layers 142 to connect the conductive terminals 150, and the lowest layer of the conductive layers 144 is exposed by the lowest layer of the dielectric layers 142 to connect the through semiconductor vias 105 of the first die 100. Although three layers of the conductive layers 144 and three layers of dielectric layers 142 are illustrated herein, the scope of the disclosure is not limited by the embodiments of the disclosure. In other embodiments, the number of the conductive layers 144 and the number of the dielectric layers 142 may be adjusted based on product requirement.

In some embodiments, the material of the dielectric layers 142 may include polyimide (PI), polybenzoxazole (PBO), benzocyclobutene (BCB), a nitride such as silicon nitride ($SiN_x$, where x>0), an oxide such as silicon oxide ($SiO_x$, where x>0), phosphosilicate glass (PSG), borosilicate glass (BSG), boron-doped phosphosilicate glass (BPSG), a combination thereof or the like, which may be patterned using a photolithography and/or etching process. In some embodiments, the dielectric layers 142 may be formed by suitable fabrication techniques such as spin-on coating, CVD, HDPCVD, PECVD, ALD or the like. In some embodiments, the conductive layers 144 may be made of conductive materials formed by electroplating or deposition, such as aluminum, titanium, copper, nickel, tungsten, and/or alloys thereof. In some embodiments, the conductive layers 144 may be patterned using a photolithography and etching process. In some embodiments, the conductive layers 144 may be patterned copper layers or other suitable patterned metal layers.

After forming the redistribution layer 140, the conductive terminals 150 are formed on the redistribution layer 140. In certain embodiments, as shown in FIG. 4F, the conductive terminals 150 are formed on the exposed top surface of the topmost layer of the conductive layers 144 of the redistribution layer 140. In some embodiments, the material of the conductive terminals 150 may include a metal material such as copper or copper alloys. In some embodiments, the conductive terminals 150 may include copper pillars, copper posts or copper vias. In some embodiments, the conductive terminals 150 may be formed by a plating process (e.g., electroplating process or electroless plating process). In some embodiments, through the redistribution layer 140, the conductive terminals 150 are electrically connected to the first die 100. In some alternative embodiments, glops (not shown) may be formed on the conductive terminals 150. In some embodiments, the material of the glops (not shown) may include solder. In some embodiments, the conductive terminals 150 and the glops formed on the conductive terminals 150 may be collectively referred to as micro bumps.

After forming the conductive terminals 150, the carrier C is debonded from the second die 110, the third die 120 and the encapsulant 130. Subsequently, a singulation process is performed along the intersected scribe lanes SL to cut the thinned molded wafer MW and the redistribution layer 140, such that the singulated die stack structures 10 (as shown in FIG. 1) are obtained. In some embodiments, the singulation process may be a wafer dicing process including mechanical blade sawing or laser cutting. In other words, the singulation process may involve dicing the thinned molded wafer MW and the redistribution layer 140 with a saw blade or a laser beam.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Figure 6:
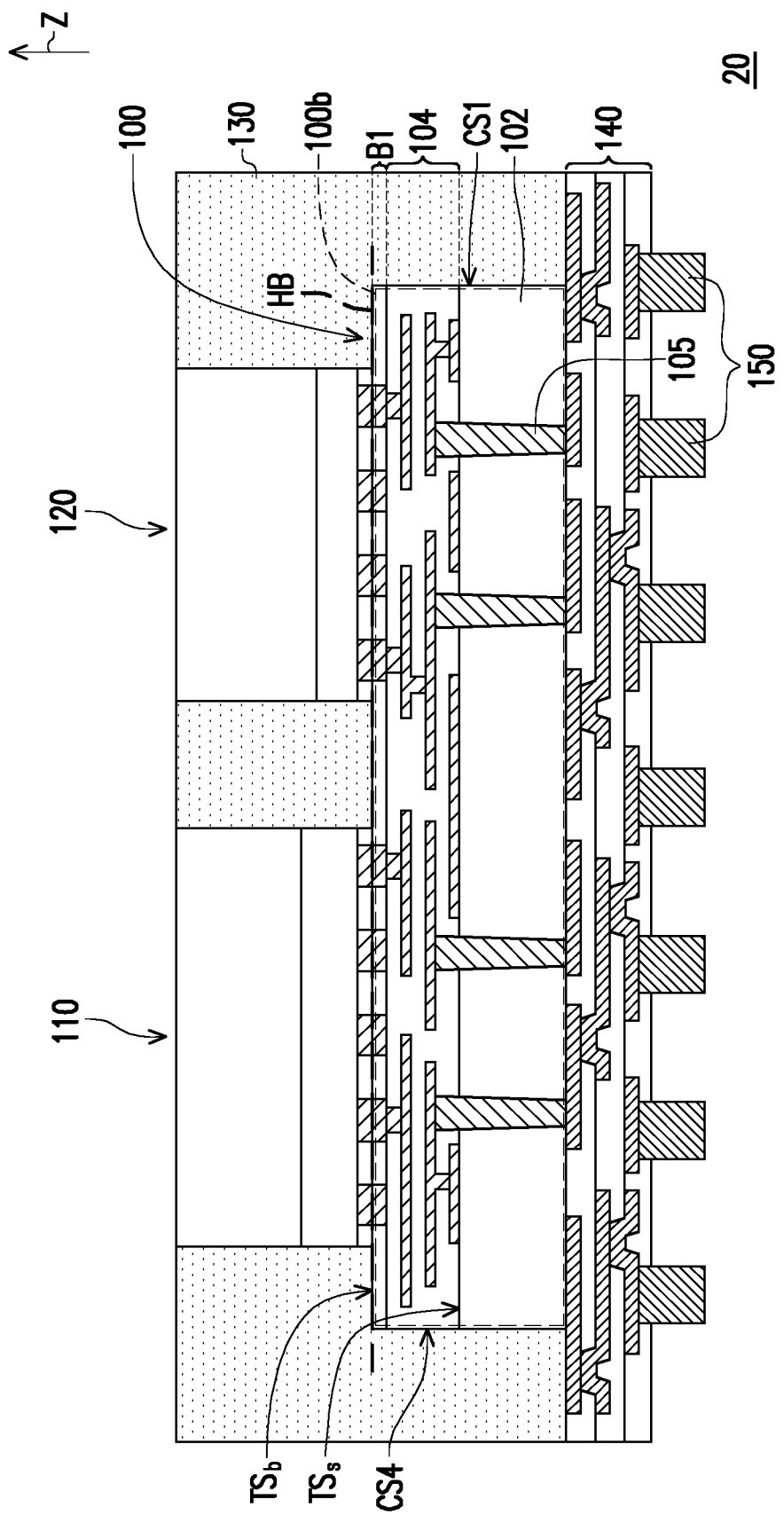
FIG. 6 is a schematic cross-sectional view of a die stack structure in accordance with some alternative embodiments of the present disclosure.
Figure 7:
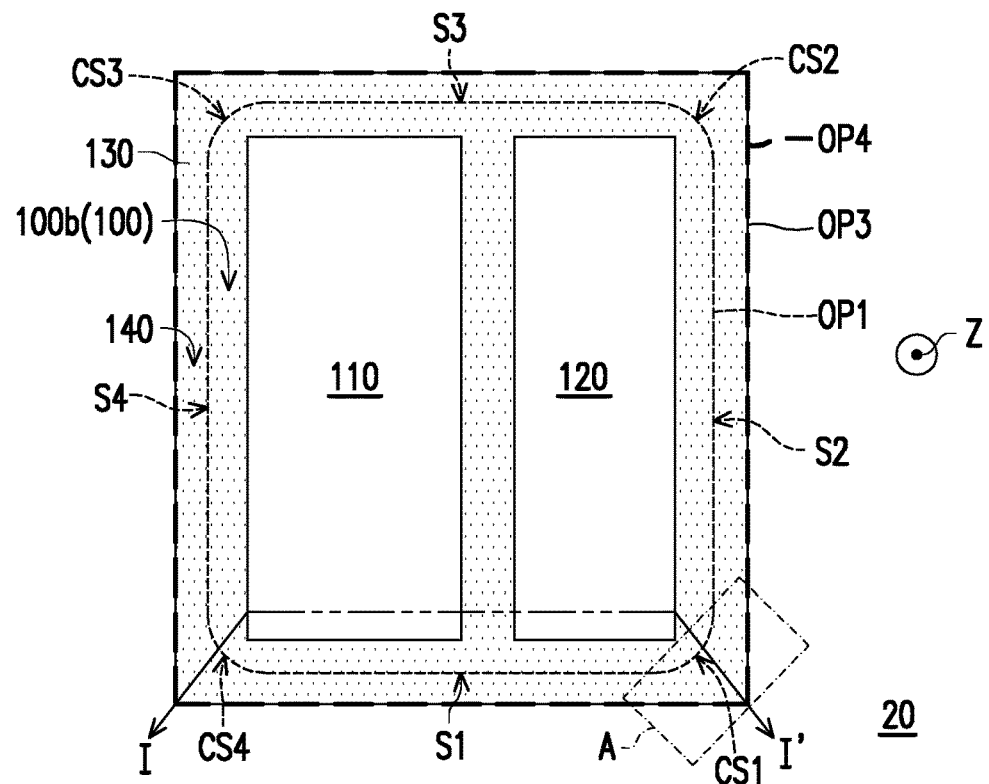
FIG. 7 is a schematic top view of a die stack structure in accordance with some alternative embodiments of the present disclosure.
Figure 8:
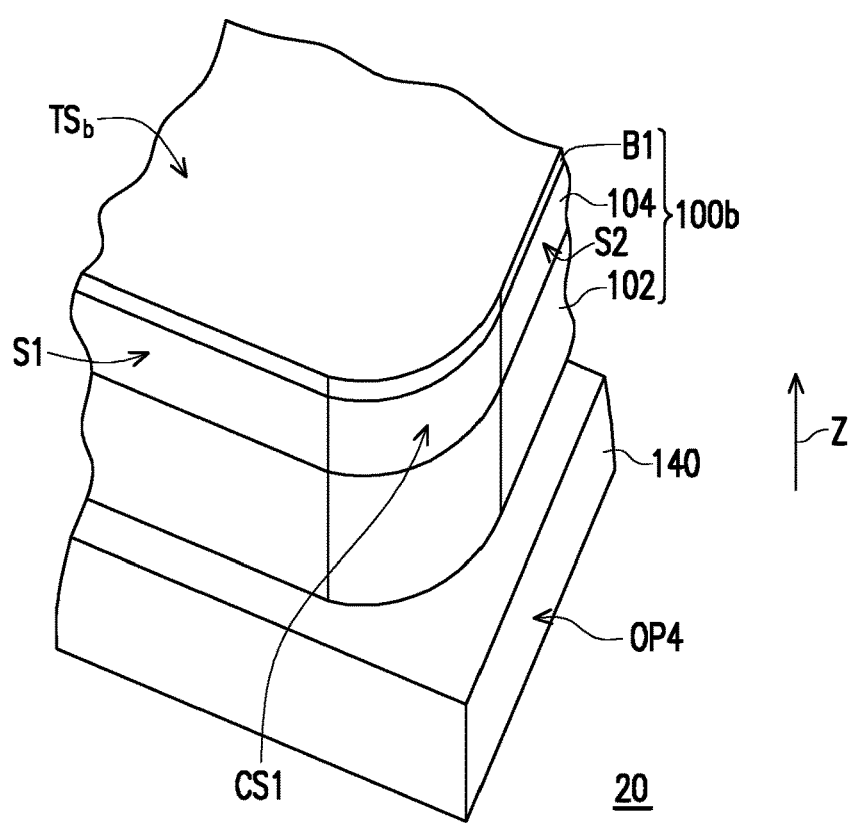
FIG. 8 is a schematic perspective view of a portion of a die stack structure in accordance with some alternative embodiments of the present disclosure.

FIG. 6 is a schematic cross-sectional view of a die stack structure in accordance with some alternative embodiments of the present disclosure. FIG. 7 is a schematic top view of a die stack structure in accordance with some alternative embodiments of the present disclosure. FIG. 8 is a schematic perspective view of a portion of a die stack structure in accordance with some alternative embodiments of the present disclosure. Specifically, FIG. 6 is a cross-sectional view taken along the line I-I' of FIG. 7, and FIG. 8 is an enlarged perspective view of the dashed area A outlined in FIG. 7. For simplicity and clarity of illustration, only few elements such as first to third dies, an encapsulant and a redistribution layer are shown in the simplified top view of FIG. 7, and these elements are not necessarily in the same plane. And, it should be noted that an encapsulant is omitted in FIG. 8 for simplicity and clarity of illustration.

Referring to FIGS. 6-8 along with FIGS. 1-3, the die stack structure 20 illustrated in FIGS. 6-8 is similar to the die stack structure 10 illustrated in FIGS. 1-3, hence the same reference numerals are used to refer to the same or liked parts, and its detailed description will be omitted herein. The differences between the die stack structure 20 illustrated in FIGS. 6-8 and the die stack structure 10 illustrated in FIGS. 1-3 will be described below.

Referring to FIGS. 6-8 along with FIGS. 1-3, the main difference between the die stack structure 20 and the die stack structure 10 lies in that the first die 100 of the die stack structure 20 includes only the body portion 100b without the flange portion (e.g., the flange portion 100f shown in FIG. 1). As such, referring to FIG. 6 and FIG. 7, the encapsulant 130 laterally encapsulates all of the first die 100, the second die 110 and the third die 120, and physically contacts the redistribution layer 140. Furthermore, according to the descriptions with respect to FIGS. 1, 2, 3 and 4A-4F, those skilled in the art should understand that the die stack structure 20 may be manufactured following the method described above in conjunction with FIGS. 4A-4F, except that the ring-shaped trench U formed in the trench forming process has a bottom surface $BS_U$ lower than the bottom surfaces $S_{105}$ of the through semiconductor vias 105 or laterally aligned with the bottom surfaces $S_{105}$ of the through semiconductor vias 105. In the case that the bottom surface $BS_U$ is lower than the bottom surfaces $S_{105}$ or is not vertically offset from the bottom surfaces $S_{105}$, during the thinning down process of the molded wafer MW, the bottom surfaces $S_{105}$ of the through semiconductor vias 105 are revealed, while the flange portion 100f is removed.

Figure 9:
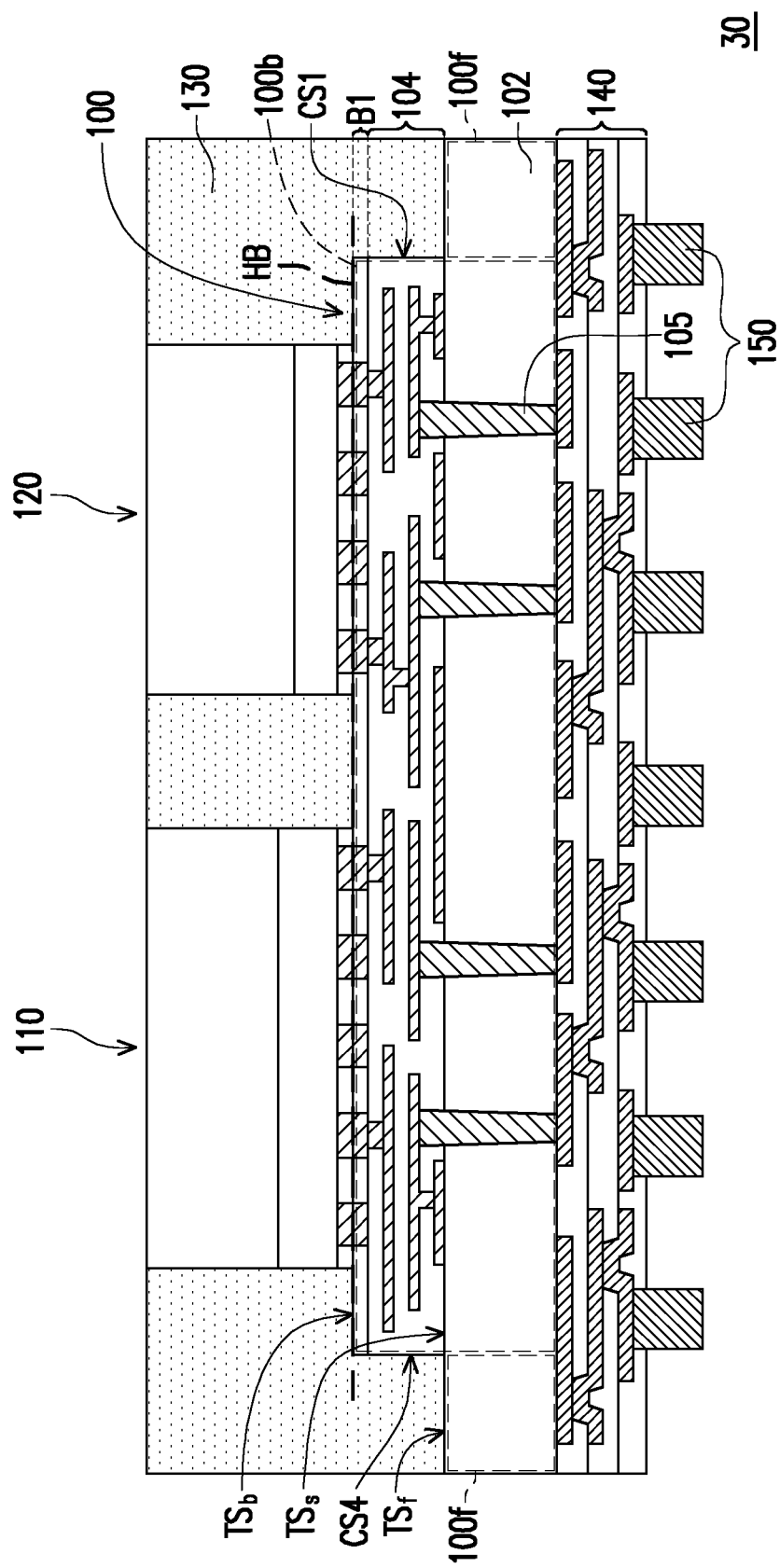
FIG. 9 is a schematic cross-sectional view of a die stack structure in accordance with some alternative embodiments of the present disclosure.

FIG. 9 is a schematic cross-sectional view of a die stack structure in accordance with some alternative embodiments of the present disclosure. The die stack structure 30 illustrated in FIG. 9 is similar to the die stack structure 10 illustrated in FIG. 1, hence the same reference numerals are used to refer to the same or liked parts, and its detailed description will be omitted herein. The differences between the die stack structure 30 illustrated in FIG. 9 and the die stack structure 10 illustrated in FIG. 1 will be described below.

Referring to FIG. 9, in the die stack structure 30, the illustrated top surface $TS_f$ of the flange portion 100f is laterally aligned with the illustrated top surface $TS_s$ of the semiconductor substrate 102 in the body portion 100b. That is to say, the illustrated top surface $TS_f$ of the flange portion 100f is not vertically offset from the illustrated top surface $TS_s$ of the semiconductor substrate 102 in the body portion 100b. In other words, the illustrated top surface $TS_f$ of the flange portion 100f is substantially flush with or coplanar with the illustrated top surface $TS_s$ of the semiconductor substrate 102 in the body portion 100b. Accordingly, in the die stack structure 30, the portion of the body portion 100b protruding from the flange portion 100f along the direction Z is constituted by the bonding structure B1 and the interconnect structure 104. Furthermore, according to the descriptions with respect to FIGS. 1, 2, 3 and 4A-4F, those skilled in the art should understand that the die stack structure 30 may be manufactured following the method described above in conjunction with FIGS. 4A-4F, except that the ring-shaped trench U formed in the trench forming process does not extend into the semiconductor substrate 102. That is to say, the trench forming process performed in the method of manufacturing the die stack structure 30 etches through the interconnect structure 104, but does not etch into the semiconductor substrate 102. In some exemplary embodiments, an anisotropic etching performed during the trench forming process may not over etch and remove a portion of the semiconductor substrate 102.

Figure 10:
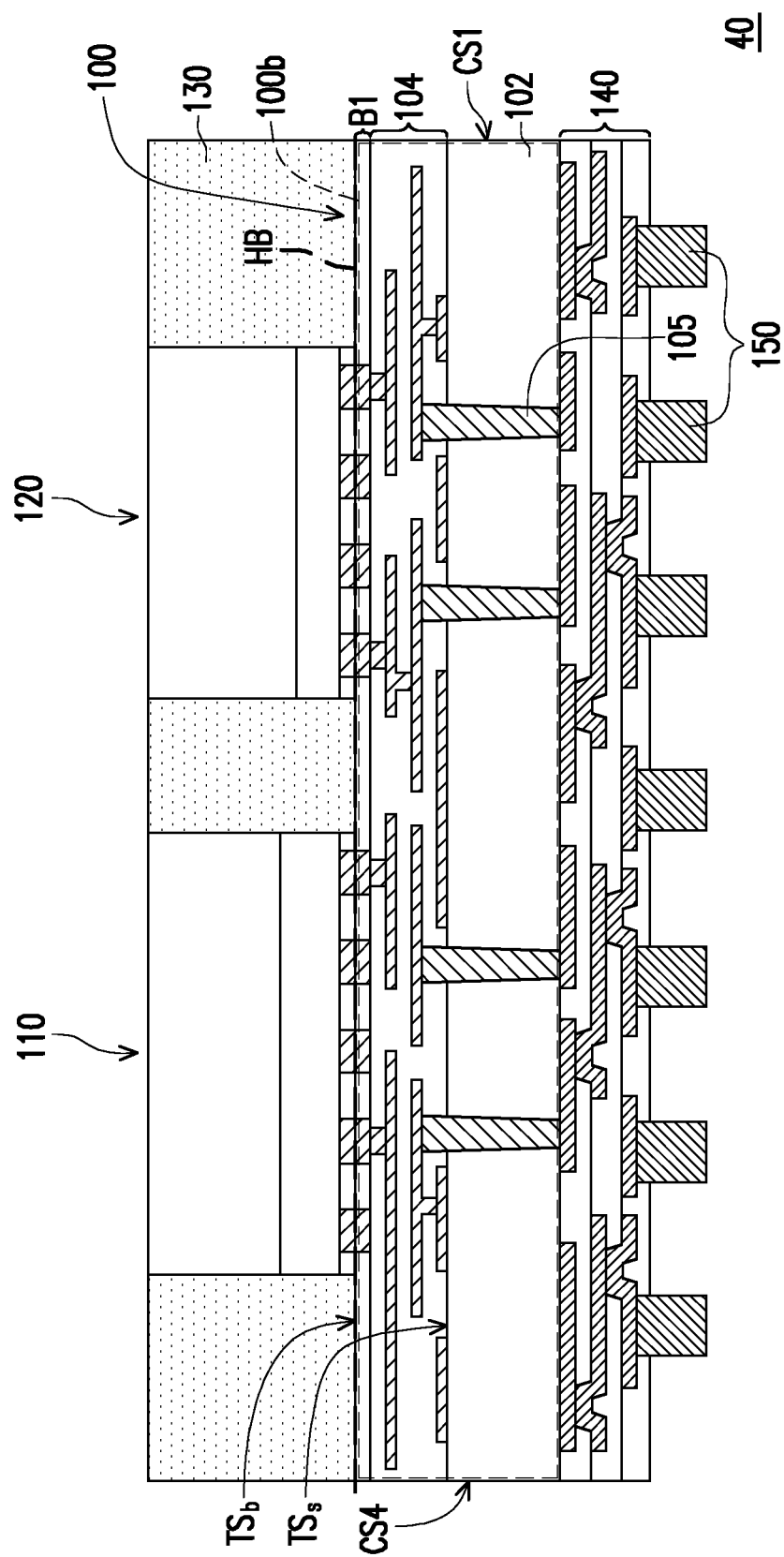
FIG. 10 is a schematic cross-sectional view of a die stack structure in accordance with some alternative embodiments of the present disclosure.
Figure 11:
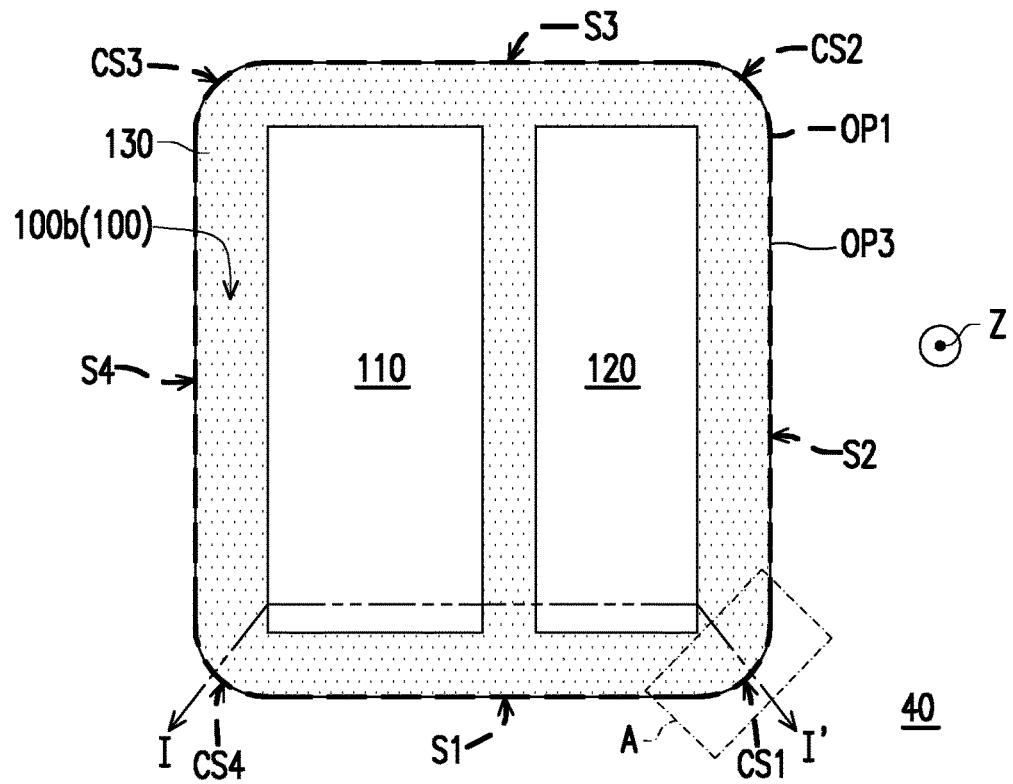
FIG. 11 is a schematic top view of a die stack structure in accordance with some alternative embodiments of the present disclosure.
Figure 12:
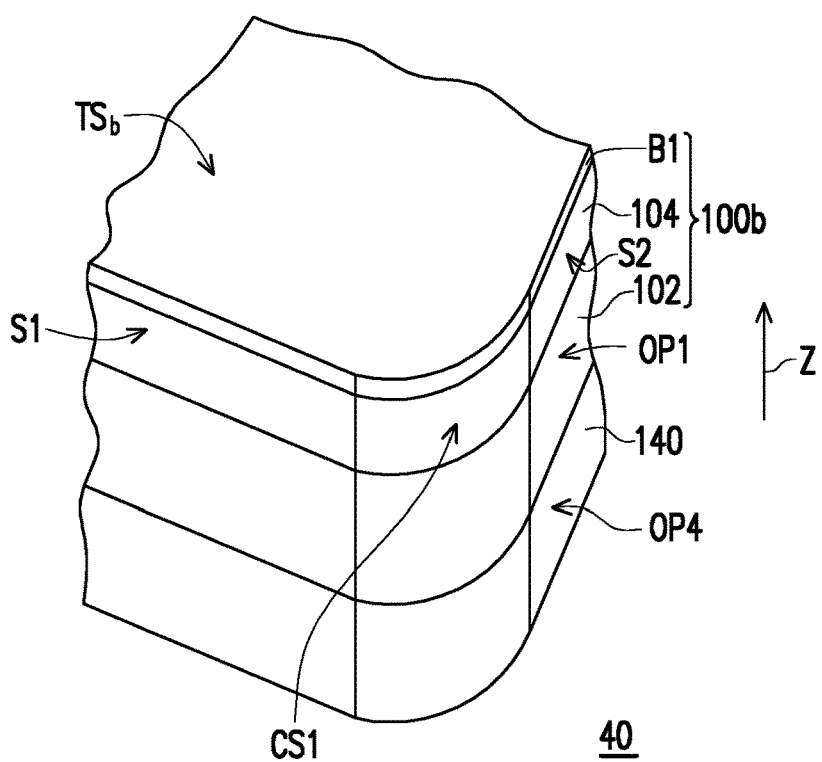
FIG. 12 is a schematic perspective view of a portion of a die stack structure in accordance with some alternative embodiments of the present disclosure.

FIG. 10 is a schematic cross-sectional view of a die stack structure in accordance with some alternative embodiments of the present disclosure. FIG. 11 is a schematic top view of a die stack structure in accordance with some alternative embodiments of the present disclosure. FIG. 12 is a schematic perspective view of a portion of a die stack structure in accordance with some alternative embodiments of the present disclosure. Specifically, FIG. 10 is a cross-sectional view taken along the line I-I' of FIG. 11, and FIG. 12 is an enlarged perspective view of the dashed area A outlined in FIG. 11. For simplicity and clarity of illustration, only few elements such as first to third dies and an encapsulant are shown in the simplified top view of FIG. 11, and these elements are not necessarily in the same plane. And, it should be noted that an encapsulant is omitted in FIG. 12 for simplicity and clarity of illustration.

Referring to FIGS. 10-12 along with FIGS. 1-3, the die stack structure 40 illustrated in FIGS. 10-12 is similar to the die stack structure 10 illustrated in FIGS. 1-3, hence the same reference numerals are used to refer to the same or liked parts, and its detailed description will be omitted herein. The differences between the die stack structure 40 illustrated in FIGS. 10-12 and the die stack structure 10 illustrated in FIGS. 1-3 will be described below.

Referring to FIG. 10, FIG. 11 and FIG. 12, in the die stack structure 40, the first die 100 includes only the body portion 100b without the flange portion (e.g., the flange portion 100f shown in FIG. 1). Further, referring to FIG. 10, FIG. 11 and FIG. 12, in the die stack structure 40, the outer profile OP3 of the encapsulant 130 is vertically aligned with the outer profile OP1 of the body portion 100b, and also the outer profile OP4 of the redistribution layer 140 is vertically aligned with the outer profile OP1 of the body portion 100b. That is to say, the outer profile OP1 of the body portion 100b, the outer profile OP3 of the encapsulant 130 and the outer profile OP4 of the redistribution layer 140 are not laterally offset from one another. In other words, from the top view, the outer profile OP3 of the encapsulant 130 and the outer profile OP4 of the redistribution layer 140 respectively exhibit the same shape as that of the outer profile OP1 of the body portion 100b. As shown in FIG. 11, from the top view, the outer profile OP3 of the encapsulant 130 exhibits a rounded corner rectangle shape the same as the outer profile OP1 of the body portion 100b. Accordingly, the encapsulant 130 has four curved side surfaces respectively vertically aligned with the first curved side surface CS1, the second curved side surface CS2, the third curved side surface CS3 and the fourth curved side surface CS4 of the body portion 100b. Since the outer profile OP4 of the redistribution layer 140 is vertically aligned with the outer profile OP1 of the body portion 100b, the redistribution layer 140 right under the first die 100 is omitted in the top view of FIG. 11. According to the descriptions with respect to FIG. 11, those skilled in the art should understand that the outer profile OP4 of the redistribution layer 140 right under the first die 100 also exhibits a rounded corner rectangle shape the same as the outer profile OP1 of the body portion 100b, and the redistribution layer 140 has four curved side surfaces respectively vertically aligned with the first curved side surface CS1, the second curved side surface CS2, the third curved side surface CS3 and the fourth curved side surface CS4 of the body portion 100b.

Figure 13A:
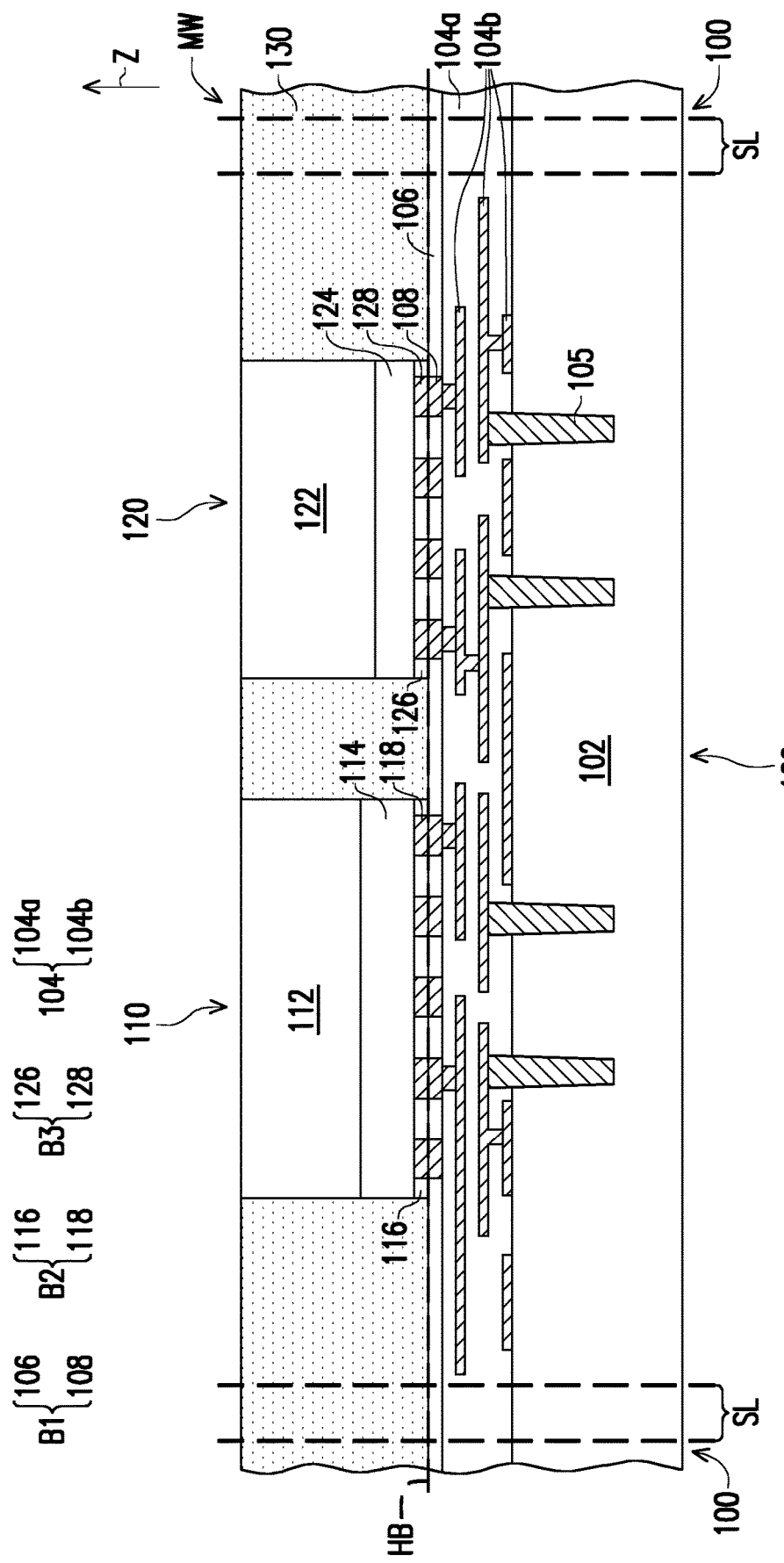
FIG. 13A to FIG. 13C are schematic cross-sectional views of various stages in a method of manufacturing a die stack structure in accordance with some alternative embodiments of the present disclosure.
Figure 13B:
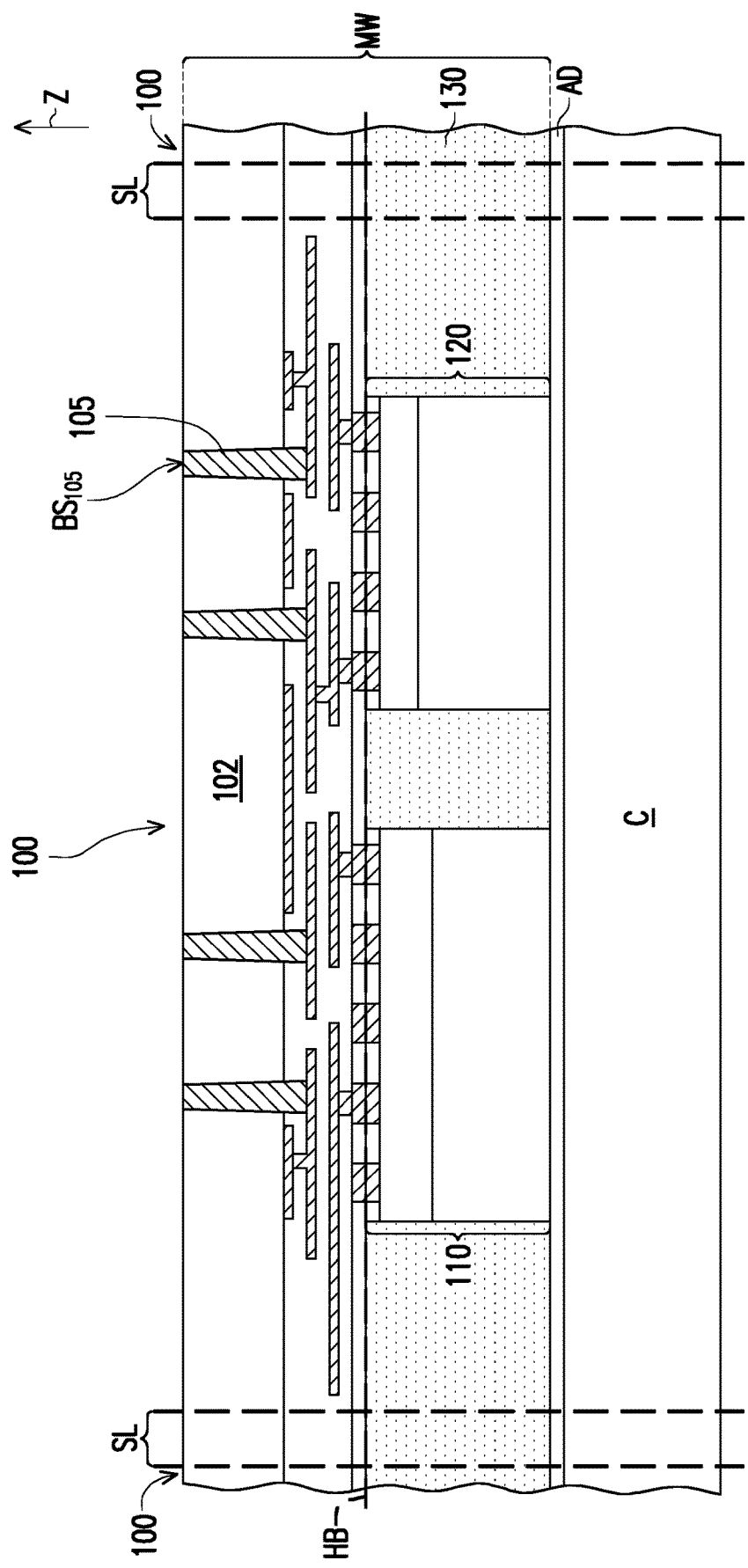
Figure 13C:
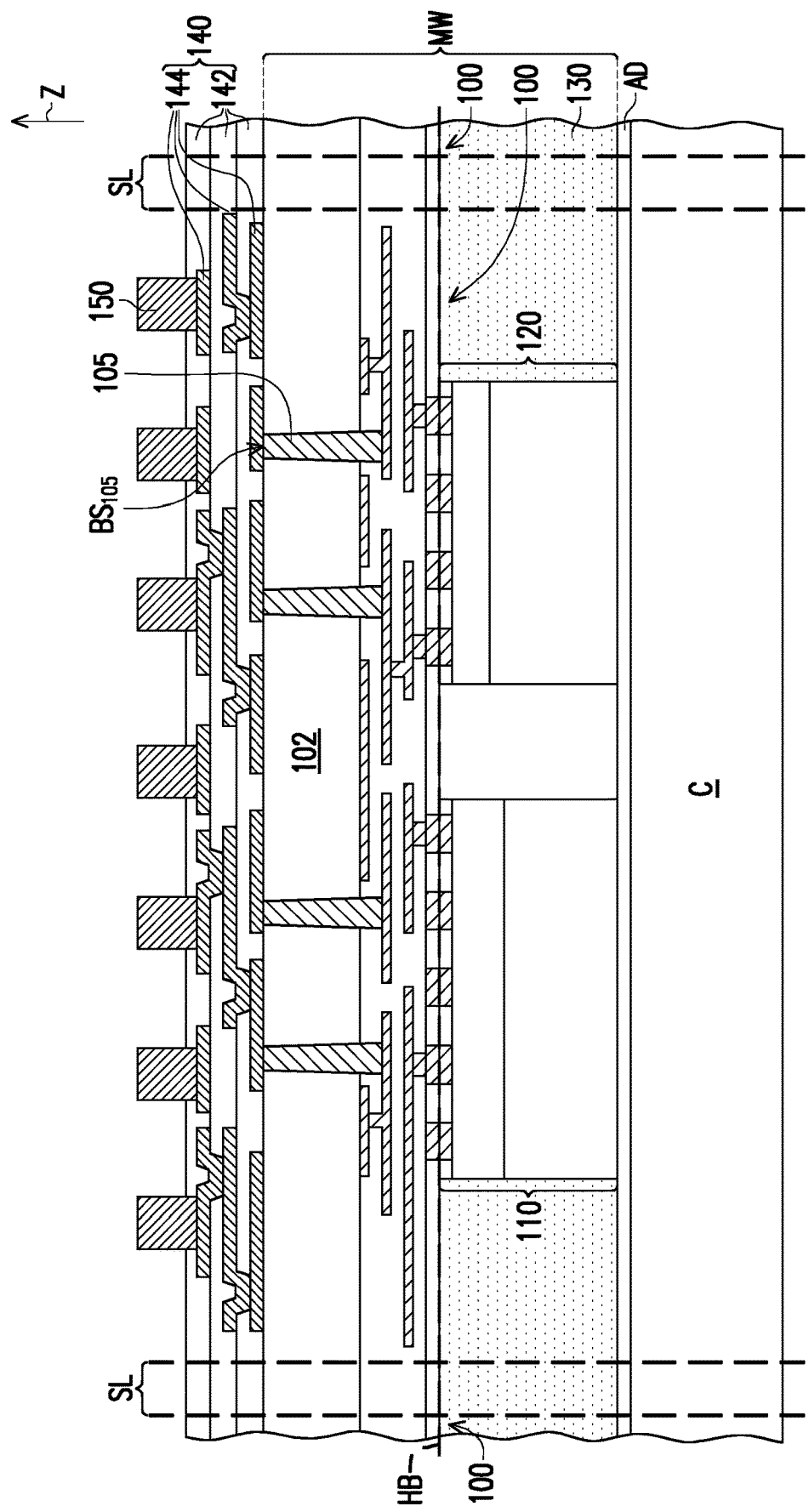

The features of the die stack structure 40 will be discussed in further detail below in conjunction with FIG. 13A to FIG. 13C. FIG. 13A to FIG. 13C are schematic cross-sectional views of various stages in a manufacturing method of the die stack structure 40 in accordance with some embodiments of the present disclosure. The elements similar to or substantially the same as the elements described previously will use the same reference numbers, and certain details or descriptions (e.g. the materials, formation processes, positioning configurations, etc.) of the same elements would not be repeated herein.

Referring to FIG. 13A, a structure same as the structure of FIG. 4A is provided. Details or descriptions (e.g. the materials, formation processes, positioning configurations, etc.) of the semiconductor wafer WF and the first die 100 have been described in conjunction with FIG. 4A above, and will not be iterated herein again. Accordingly, for details or descriptions of the semiconductor wafer WF and the first die 100 not iterated herein, please refer to the aforesaid embodiments.

Continued on FIG. 13A, a second die 110 and a third die 120 are bonded to the first die 100 through a bonding process. In some embodiments, as shown in FIG. 13A, during the bonding process, the second die 110 and the third die 120 both are hybrid bonded to the first die 100, and a hybrid bonding interface HB (represented by the dash line in FIG. 13A) is achieved between the second die 110 and the first die 100 and between the third die 120 and the first die 100. In some embodiments, the second die 110 may include a semiconductor substrate 112, a interconnect structure 114 and a bonding structure B2, and the third die 120 may include a semiconductor substrate 122, a interconnect structure 124, and a bonding structure B3. Details or descriptions (e.g. the materials, formation processes, positioning configurations, etc.) of the second die 110, the third die 120 and the bonding process have been described in conjunction with FIG. 4C and FIG. 4D above, and will not be iterated herein again. Accordingly, for details or descriptions of the second die 110, the third die 120 and the bonding process not iterated herein, please refer to the aforesaid embodiments.

Continued on FIG. 13A, after the bonding process of the first die 100, the second die 110 and the third die 120 is performed, an encapsulant 130 is formed over the semiconductor wafer WF to form a molded wafer MW. In some embodiments, as shown in FIG. 13A, the encapsulant 130 is formed to fill the gap between the second die 110 and the third die 120 and wraps around the sidewalls of the second die 110 and the third die 120. That is to say, the encapsulant 130 laterally encapsulates the second die 110 and the third die 120. Details or descriptions (e.g. the materials, formation processes, positioning configurations, etc.) of the encapsulant 130 and the molded wafer MW have been described in conjunction with FIG. 4D above, and will not be iterated herein again. Accordingly, for details or descriptions of the encapsulant 130 and the molded wafer MW not iterated herein, please refer to the aforesaid embodiments.

Referring to FIG. 13B, after the molded wafer MW is formed, a carrier C is provided and bonded on the second die 110, the third die 120 and the encapsulant 130. In some embodiments, the carrier C is boned to the second die 110, the third die 120 and the encapsulant 130 through an adhesive layer AD, as shown in FIG. 13B. Details or descriptions (e.g. the materials, formation processes, positioning configurations, etc.) of the carrier C and the adhesive layer AD have been described in conjunction with FIG. 4E above, and will not be iterated herein again. Accordingly, for details or descriptions of the carrier C and the adhesive layer AD not iterated herein, please refer to the aforesaid embodiments.

Continued on FIG. 13B, after the carrier C is bonded to the molded wafer MW, the resulted structure is flipped (turned upside down) and the molded wafer MW is subjected to a thinning down process from the backside. In some embodiments, as shown in FIG. 13B, during the thinning down process, the semiconductor substrate 102 of the first die 100 is thinned or partially removed to reveal the illustrated top surfaces $S_{105}$ of the through semiconductor vias 105. In some embodiments, after the thinning down process, the illustrated top surfaces $S_{105}$ of the through semiconductor vias 105 are substantially flush or coplanar with the illustrated top surface of the thinned semiconductor substrate 102. In some embodiments, the through semiconductor vias 105 penetrate through the thinned semiconductor substrate 102 for dual-side connection (as shown in FIG. 13C). In some embodiments, the thinning down process may include a polishing process, an etching process or a combination thereof.

Referring to FIG. 13C, after the thinning down process, a redistribution layer 140 conductive terminals 150 are sequentially formed on the thinned molded wafer MW. In some embodiments, the redistribution layer 140 includes one or more dielectric layers 142, and one or more conductive layers 144. Details or descriptions (e.g. the materials, formation processes, positioning configurations, etc.) of the redistribution layer 140 have been described in conjunction with FIG. 4F above, and will not be iterated herein again. Accordingly, for details or descriptions of the redistribution layer 140 not iterated herein, please refer to the aforesaid embodiments. After forming the redistribution layer 140, the conductive terminals 150 are formed on and electrically connected to the redistribution layer 140. Details or descriptions (e.g. the materials, formation processes, positioning configurations, etc.) of the conductive terminals 150 have been described in conjunction with FIG. 4F above, and will not be iterated herein again. Accordingly, for details or descriptions of the conductive terminals 150 not iterated herein, please refer to the aforesaid embodiments.

Continued on FIG. 13C, after forming the conductive terminals 150, the carrier C is debonded from the second die 110, the third die 120 and the encapsulant 130. Subsequently, a singulation process is performed along the intersected scribe lanes SL to cut the thinned molded wafer MW and the redistribution layer 140, such that the singulated die stack structures 40 (as shown in FIG. 10) are obtained. In some embodiments, the singulation process may be a wafer dicing process including laser cutting. In other words, the singulation process may involve dicing the thinned molded wafer MW and the redistribution layer 140 with a laser beam. As mentioned above, the outer profile OP1 of the body portion 100b, the outer profile OP3 of the encapsulant 130 and the outer profile OP4 of the redistribution layer 140 are vertically aligned with one another. As such, in some exemplary embodiments, a laser beam used in the singulation process may dice the thinned molded wafer MW and the redistribution layer 140 along the outer profile OP1 of the body portion 100b to singulate the die stack structures 40. That is to say, the scribe line SL may extend laterally in a closed path consisting with the outer profile OP1 of the body portion 100b to surround the die stack structure 40. In other words, during singulation process, the thinned molded wafer MW and the redistribution layer 140 are cut to render the die stack structures 40 with non-sharp corners.

As mentioned above, the non-sharp corners of the first die 100 aids releasing stress resulted from CTE mismatch between the encapsulant 130 and the first die 100. As such, by rendering the non-sharp corners to the first die 100 during the singulation process, even stress is induced in the die stack structure 40 because of CTE mismatch between the encapsulant 130 and the first die 100, issues including crack and/or delamination originated from sharp corners can be eliminated. Further, since during the singulation process, the interconnect structure 104 is cut to have the non-sharp corners, even stress is induced in the die stack structure 40 because of CTE mismatch between the encapsulant 130 and the first die 100, the crack and/or delamination prone to occur at the fragile material in the interconnect structure 104 can effectively be suppressed. As a result, the negative effects originated from sharp corners may be sufficiently eliminated, thereby ensuring the performance and efficiency of the subsequently formed device.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

In the aforesaid embodiments with respect to FIGS. 1-13C, the non-sharp corners of the body portion 100b are occupied by the first curved side surface CS1, the second curved side surface CS2, the third curved side surface CS3 and the fourth curved side surface CS4. However, the disclosure is not limited thereto. In some alternative embodiments, the non-sharp corner may be occupied by one or more side surfaces. Hereinafter, other configurations of the body portion will be discussed in conjunction with FIG. 14 and FIG. 15.

Figure 14:
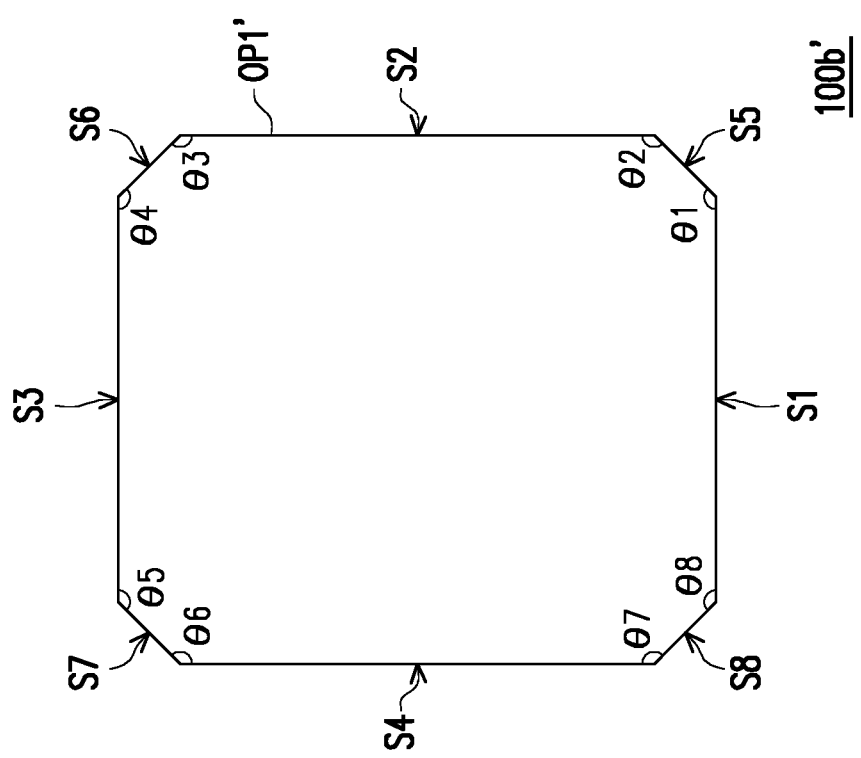
FIG. 14 is a schematic top view of a portion of a die stack structure in accordance with some alternative embodiments of the present disclosure.

FIG. 14 is a schematic top view of a portion of a die stack structure in accordance with some alternative embodiments of the present disclosure. Referring to FIG. 14 and FIG. 2, the body portion 100b' illustrated in FIG. 14 is similar to the body portion 100b illustrated in FIG. 2, hence the same reference numerals are used to refer to the same or liked parts, and its detailed description will be omitted herein. The differences between the body portion 100b' illustrated in FIG. 14 and the body portion 100b illustrated in FIG. 2 will be described below.

Referring to FIG. 14, from the top view, the non-sharp corners of the body portion 100b' are occupied by a side surface S5, a side surface S6, a side surface S7, a side surface S8. In some embodiments, the side surface S5 is located between the first side surface S1 and the second side surface S2, the side surface S6 is located between the second side surface S2 and the third side surface S3, the side surface S7 is located between the third side surface S3 and the fourth side surface S4, and the side surface S8 is located between the fourth side surface S4 and the first side surface S1. In some embodiments, the side surface S5 connects the first side surface S1 and the second side surface S2, the side surface S6 connects the second side surface S2 and the third side surface S3, the side surface S7 connects the third side surface S3 and the fourth side surface S4, and the side surface S8 connects the fourth side surface S4 and the first side surface S1.

As shown in FIG. 14, from the top view, the body portion 100b' may have an outer profile OP1' that exhibits an octangle shape. In some embodiments, two adjacent side surfaces of the body portion 100b' form an obtuse angle. In some exemplary embodiments, as shown in FIG. 14, an included angle θ1 between the first side surface S1 and the side surface S5 is an obtuse angle, an included angle θ2 between the side surface S5 and the second side surface S2 is an obtuse angle, an included angle θ3 between the second side surface S2 and the side surface S6 is an obtuse angle, an included angle θ4 between the side surface S6 and the third side surface S3 is an obtuse angle, an included angle θ5 between the third side surface S3 and the side surface S7 is an obtuse angle, an included angle θ6 between the side surface S7 and the fourth side surface S4 is an obtuse angle, an included angle θ7 between the fourth side surface S4 and the side surface S8 is an obtuse angle, an included angle θ8 between the side surface S8 and the first side surface S1 is an obtuse angle. In some embodiments, each of the included angle θ1, the included angle θ2, the included angle θ3, the included angle θ4, the included angle θ5, the included angle θ6, the included angle θ7, and the included angle θ8 is greater than 90° and less than 180°. In some embodiments, the included angle θ1, the included angle θ2, the included angle θ3, the included angle θ4, the included angle θ5, the included angle θ6, the included angle θ7, and the included angle θ8 may be the same or different.

Figure 15:
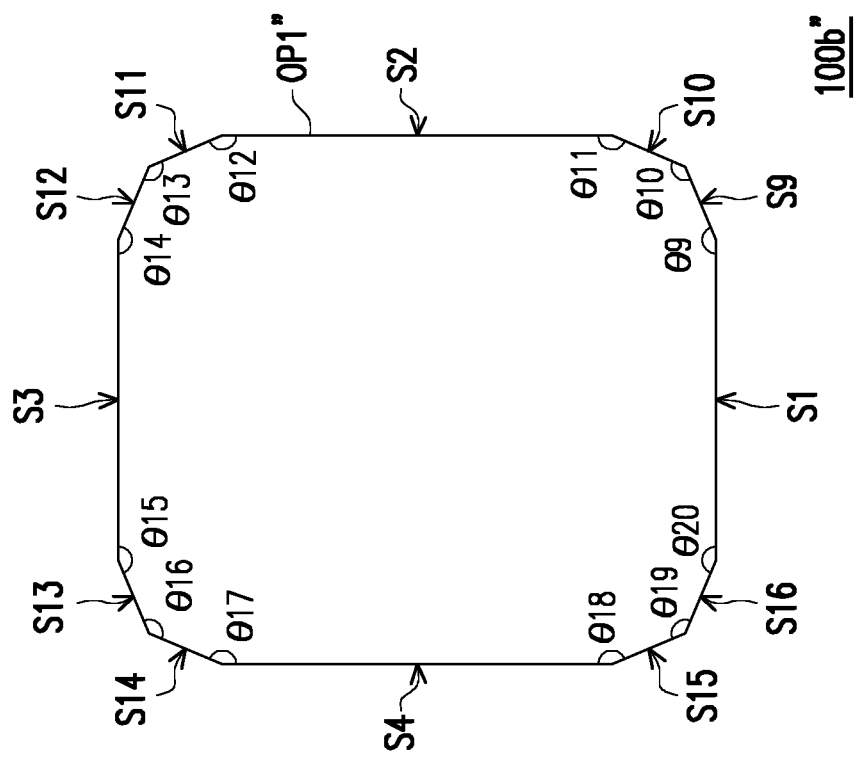
FIG. 15 is a schematic top view of a portion of a die stack structure in accordance with some alternative embodiments of the present disclosure.

FIG. 15 is a schematic top view of a portion of a die stack structure in accordance with some alternative embodiments of the present disclosure. Referring to FIG. 15 and FIG. 2, the body portion 100b" illustrated in FIG. 15 is similar to the body portion 100b illustrated in FIG. 2, hence the same reference numerals are used to refer to the same or liked parts, and its detailed description will be omitted herein. The differences between the body portion 100b" illustrated in FIG. 15 and the body portion 100b illustrated in FIG. 2 will be described below.

Referring to FIG. 15, from the top view, the non-sharp corners of the body portion 100b" are occupied by a side surface S9, a side surface S10, a side surface S11, a side surface S12, a side surface S13, a side surface S14, a side surface S15, a side surface S16. In some embodiments, the side surface S9 is located between the first side surface S1 and the side surface S10, the side surface S10 is located between the side surface S9 and the second side surface S2, the side surface S11 is located between the second side surface S2 and the side surface S12, the side surface S12 is located between the side surface S11 and the third side surface S3, the side surface S13 is located between the third side surface S3 and the side surface S14, the side surface S14 is located between the side surface S13 and the fourth side surface S4, the side surface S15 is located between the fourth side surface S4 and the side surface S16, the side surface S16 is located between the side surface S15 and the first side surface S1. In some embodiments, the side surface S9 connects the first side surface S1 and the side surface S10, the side surface S10 connects the side surface S9 and the second side surface S2, the side surface S11 connects the second side surface S2 and the side surface S12, the side surface S12 connects the side surface S11 and the third side surface S3, the side surface S13 connects the third side surface S3 and the side surface S14, the side surface S14 connects the side surface S13 and the fourth side surface S4, the side surface S15 connects the fourth side surface S4 and the side surface S16, the side surface S16 connects the side surface S15 and the first side surface S1.

As shown in FIG. 15, from the top view, the body portion 100b" may have an outer profile OP1" that exhibits a dodecagon. In some embodiments, two adjacent side surfaces of the body portion 100b" form an obtuse angle. In some exemplary embodiments, as shown in FIG. 15, an included angle θ9 between the first side surface S1 and the side surface S9 is an obtuse angle, an included angle θ10 between the side surface S9 and the side surface S10 is an obtuse angle, an included angle θ11 between the side surface S10 and the second side surface S2 is an obtuse angle, an included angle θ12 between the second side surface S2 and the side surface S11 is an obtuse angle, an included angle θ13 between the side surface S11 and the side surface S12 is an obtuse angle, an included angle θ14 between the side surface S12 and the third side surface S3 is an obtuse angle, an included angle θ15 between the third side surface S3 and the side surface S13 is an obtuse angle, an included angle θ16 between the side surface S13 and the side surface S14 is an obtuse angle, an included angle θ17 between the side surface S14 and the fourth side surface S4 is an obtuse angle, an included angle θ18 between the fourth side surface S4 and the side surface S15 is an obtuse angle, an included angle θ19 between the side surface S15 and the side surface S16 is an obtuse angle, an included angle θ20 between the side surface S16 and the side surface S1 is an obtuse angle. In some embodiments, each of the included angle θ9, the included angle θ10, the included angle θ11, the included angle θ12, the included angle θ13, the included angle θ14, the included angle θ15, the included angle θ16, the included angle θ17, the included angle θ18, the included angle θ19, and the included angle θ20 is greater than 90° and less than 180°. In some embodiments, the included angle θ9, the included angle θ10, the included angle θ11, the included angle θ12, the included angle θ13, the included angle θ14, the included angle θ15, the included angle θ16, the included angle θ17, the included angle θ18, the included angle θ19, and the included angle θ20 may be the same or different.

Figure 16A:
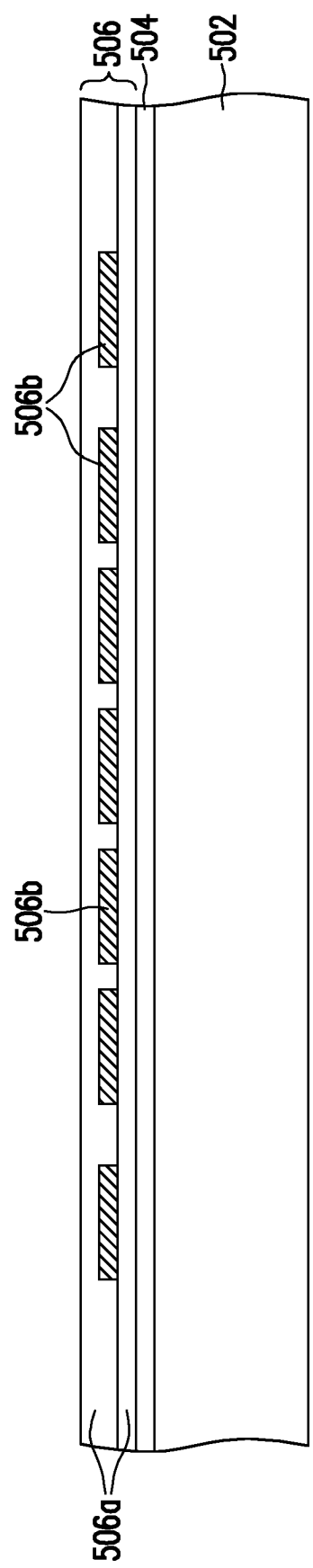
FIG. 16A to FIG. 16G are schematic cross-sectional views of various stages in a method of manufacturing a package structure in accordance with some embodiments of the present disclosure.

FIG. 16A to FIG. 16G are schematic sectional views of various stages in a method of manufacturing a package structure in accordance with some embodiments of the present disclosure. Referring to FIG. 16A, a carrier 502 is provided. In some embodiments, the carrier 502 may be a glass carrier or any suitable carrier for carrying a semiconductor wafer or a reconstituted wafer for the manufacturing method of the package structure. In some embodiments, the carrier 502 is coated with a debond layer 504. The material of the debond layer 504 may be any material suitable for bonding and de-bonding the carrier 502 from the above layer(s) or any wafer(s) disposed thereon.

In some embodiments, the debond layer 504 may include a dielectric material layer made of a dielectric material including any suitable polymer-based dielectric material (such as BCB, PBO). In some alternative embodiments, the debond layer 504 may include a dielectric material layer made of an epoxy-based thermal-release material, which loses its adhesive property when heated, such as a light-to-heat-conversion (LTHC) release layer. In some alternative embodiments, the debond layer 504 may include a dielectric material layer made of an ultra-violet (UV) glue, which loses its adhesive property when exposed to UV lights. In certain embodiments, the debond layer 504 may be dispensed as a liquid and cured, or may be a laminate film laminated onto the carrier 502. The illustrated top surface of the debond layer 504, which is opposite to the illustrated bottom surface contacting the carrier 502, may be levelled and may have a high degree of coplanarity. In certain embodiments, the debond layer 504 is, for example, a LTHC release layer with good chemical resistance, and such layer enables room temperature de-bonding from the carrier 502 by applying laser irradiation, however the disclosure is not limited thereto.

In some alternative embodiments, a buffer layer (not shown) may be coated on the debond layer 504, where the debond layer 504 is sandwiched between the buffer layer and the carrier 502, and the top surface of the buffer layer may further provide a high degree of coplanarity. In some embodiments, the buffer layer may be a dielectric material layer. In some embodiments, the buffer layer may be a polymer layer which made of PI, PBO, BCB, or any other suitable polymer-based dielectric material. In some embodiments, the buffer layer may be Ajinomoto Buildup Film (ABF), Solder Resist film (SR), or the like. In other words, the buffer layer is optional and may be omitted based on the demand, so that the disclosure is not limited thereto.

Continued on FIG. 16A, a redistribution layer 506 is formed over the carrier 502. As shown in FIG. 16A, the redistribution layer 506 is formed on the debond layer 504. In some embodiments, the formation of the redistribution layer 506 includes sequentially forming one or more dielectric layers 506a and one or more conductive layers 506b in alternation. In some embodiments, the redistribution layer 506 includes two dielectric layers 506a and one conductive layer 506b as shown in FIG. 16A, where the conductive layer 506b is sandwiched between the dielectric layers 506a. However, the disclosure is not limited thereto. The numbers of the dielectric layers 506a and the conductive layer 506b included in the redistribution layer 506 is not limited thereto, and may be designated and selected based on the demand. For example, the numbers of the dielectric layers 506a and the conductive layers 506b may be one or more than one.

In certain embodiments, the material of the dielectric layers 506a may be PI, PBO, BCB, a nitride such as silicon nitride ($SiN_x$, where x>0), an oxide such as silicon oxide ($SiO_x$, where x>0), PSG, BSG, BPSG, a combination thereof or the like, which may be patterned using a photolithography and/or etching process. In some embodiments, the dielectric layers 506a may be formed by suitable fabrication techniques such as spin-on coating, CVD, HDPCVD, PECVD, or the like. In some embodiments, the conductive layer 506b may be made of conductive materials formed by electroplating or deposition, such as aluminum, titanium, copper, nickel, tungsten, and/or alloys thereof. In some embodiments, the conductive layer 506b may be patterned using a photolithography and etching process. In some embodiments, the conductive layer 506b may be patterned copper layers or other suitable patterned metal layers.

Figure 16B:
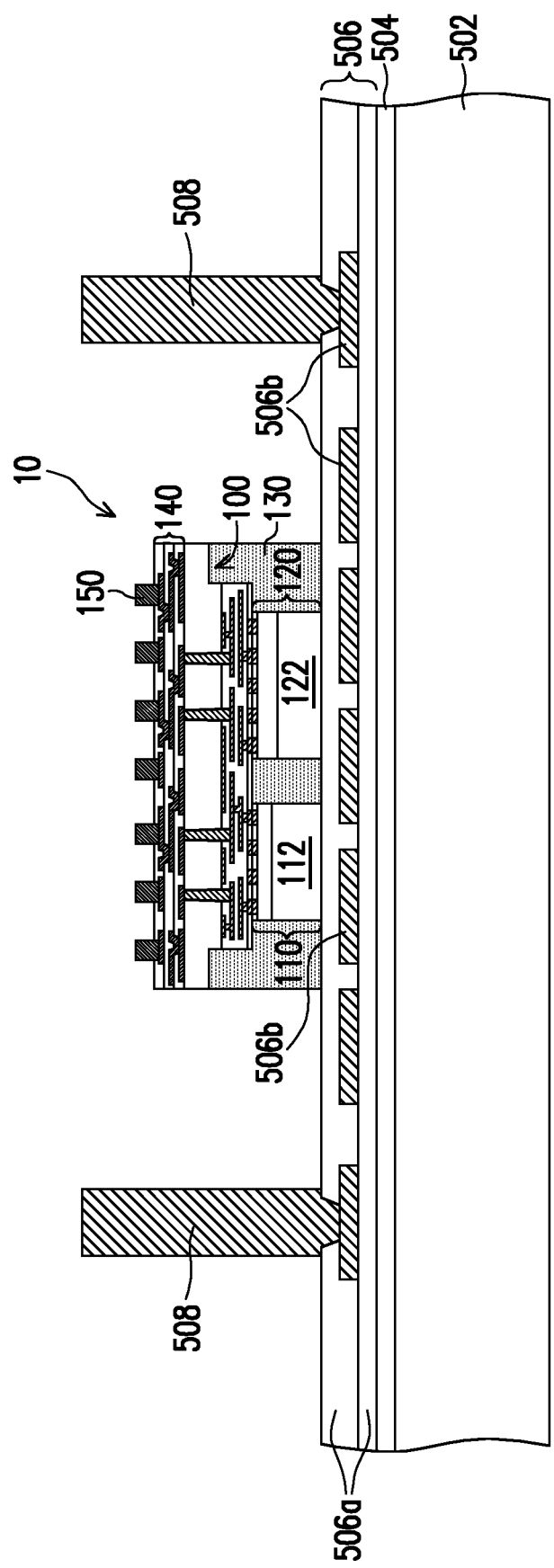

Referring to FIG. 16B, after forming the redistribution layer 506, at least one die stack structure 10 described in conjunction with FIGS. 1-5, and a plurality of through insulator vias 508 are provided on the redistribution layer 506 and over the carrier 502. In some embodiments, the through insulator vias 508 are through integrated fan-out ("InFO") vias. In one embodiment, the formation of the through insulator vias 508 includes forming a mask pattern (not shown) with openings, then forming a metallic material (not shown) filling up the openings by electroplating or deposition, and removing the mask pattern to form the through insulator vias 508 on the redistribution layer 506. In certain embodiments, the through insulator vias 508 fills into via openings that reveals the conductive layer 506b of the redistribution layer 506, so that the through insulator vias 508 may be electrically connected to the redistribution layer 506. In some embodiments, the material of the mask pattern may include a positive photo-resist or a negative photo-resist. In one embodiment, the material of the through insulator vias 508 may include a metal material such as copper or copper alloys. The disclosure is not limited thereto.

In some alternative embodiments, the through insulator vias 508 may be formed by forming a seed layer (not shown) on the redistribution layer 506; forming the mask pattern with openings exposing portions of the seed layer; forming the metallic material on the exposed portions of the seed layer to form the through insulator vias 508 by plating; removing the mask pattern; and then removing portions of the seed layer exposed by the through insulator vias 508. For example, the seed layer may be a titanium/copper composited layer. For simplification, only two through insulator vias 508 are illustrated in FIG. 16B. However, it should be noted that the number of the through insulator vias 508 is not limited thereto, and can be selected based on requirement.

Furthermore, in some embodiments, at least one die stack structure 10 is picked and placed on the redistribution layer 506. In certain embodiments, the die stack structure 10 is placed on the redistribution layer 506 in a way that the encapsulant 130, the semiconductor substrate 112 of the second die 110 and the semiconductor substrate 122 of the third die 120 are attached to the topmost dielectric layer 506a of the redistribution layer 506. For example, the encapsulant 130, the semiconductor substrate 112 of the second die 110 and the semiconductor substrate 122 of the third die 120 are attached to the redistribution layer 506 through a die attach film (not shown) or through fusion bonding. In the exemplary embodiment, only one die stack structure 10 is illustrated. However, it should be noted that the number of the die stack structure 10 placed on the redistribution layer 506 is not limited thereto, and this can be adjusted based on design requirement.

In some embodiments, when more than one die stack structure 10 are placed on the redistribution layer 506, the die stack structures 10 may be arranged in an array, and when the die stack structures 10 are arranged in an array, the through insulator vias 508 may be classified into groups. The number of the die stack structures 10 may correspond to the number of groups of the through insulator vias 508. In the exemplary embodiment, the die stack structures 10 may be picked and placed on the redistribution layer 506 after the formation of the through insulator vias 508. However, the disclosure is not limited thereto. In some alternative embodiments, the die stack structures 10 may be picked and placed on the redistribution layer 506 before the formation of the through insulator vias 508.

Figure 16C:
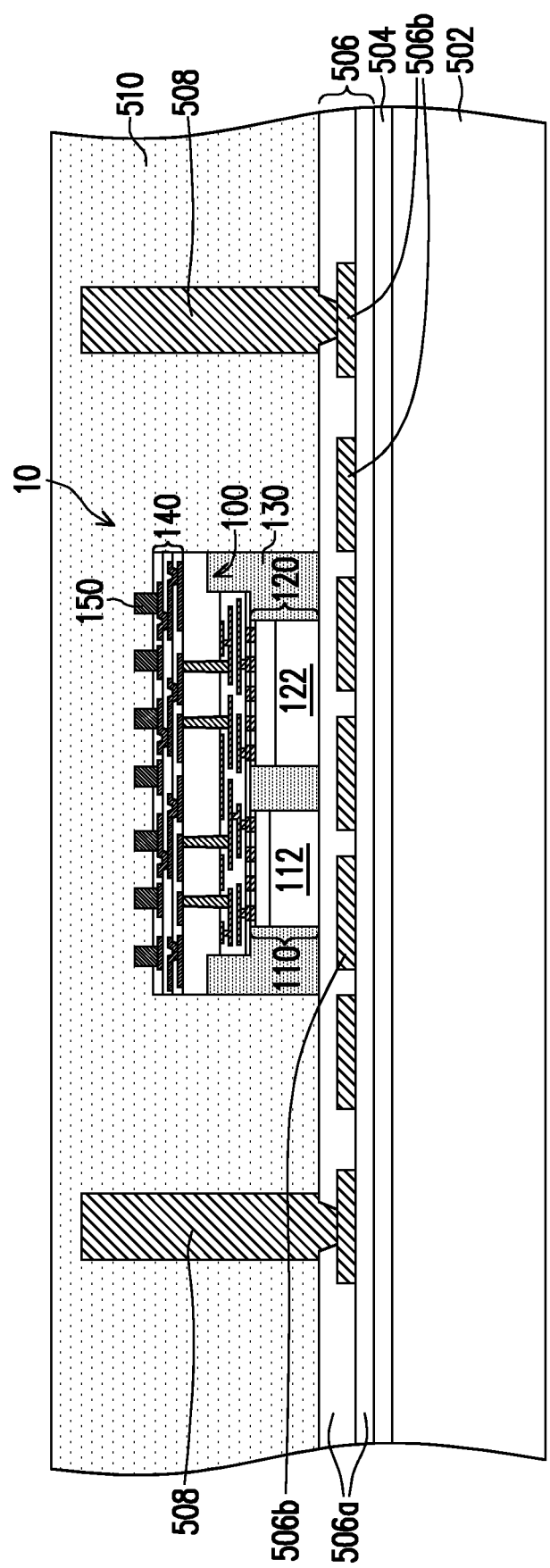

Referring to FIG. 16C, an encapsulant 510 is formed on the redistribution layer 506 and over the die stack structure 10 and the through insulator vias 508. As shown in FIG. 16C, the encapsulant 510 is formed to fill the gaps between the die stack structure 10 and the through insulator vias 508 to encapsulate the die stack structure 10. The encapsulant 510 also fills the gaps between adjacent through insulator vias 508 to encapsulate the through insulator vias 508. In some embodiments, the encapsulant 510 may be referred to as "gap-fill material". Further, as shown in FIG. 16C, the conductive terminals 150 and the redistribution layer 140 of the die stack structure 10 are encapsulated by and well protected by the encapsulant 510. In other words, the conductive terminals 150 and the redistribution layer 140 of the die stack structure 10 are not revealed. In some embodiments, the encapsulant 510 is formed through, for example, an over-molding process or a film deposition process. In some embodiments, the over-molding process is a compression molding process, for example. In some embodiments, the film deposition process may include CVD, HDPCVD, PECVD, ALD, or combinations thereof. In some embodiments, the encapsulant 510 may include a molding compound, a molding underfill, a resin (such as epoxy resin), or the like. In some alternative embodiments, the encapsulant 510 may include silicon oxide ($SiO_x$, where x>0), silicon oxynitride ($SiO_xN_y$, where x>0 and y>0), silicon nitride ($SiN_x$, where x>0), or other suitable dielectric material. In some embodiments, the encapsulant 510 may include a base material (e.g., a polymer, a resin or the like) and filler particles (e.g., silica, clay or the like) distributed in the base material. The disclosure is not limited thereto. In one embodiment, the materials of the encapsulant 130 and the encapsulant 510 are the same. In an alternative embodiment, the material of the encapsulant 510 is different from the material of the encapsulant 130.

Figure 16D:
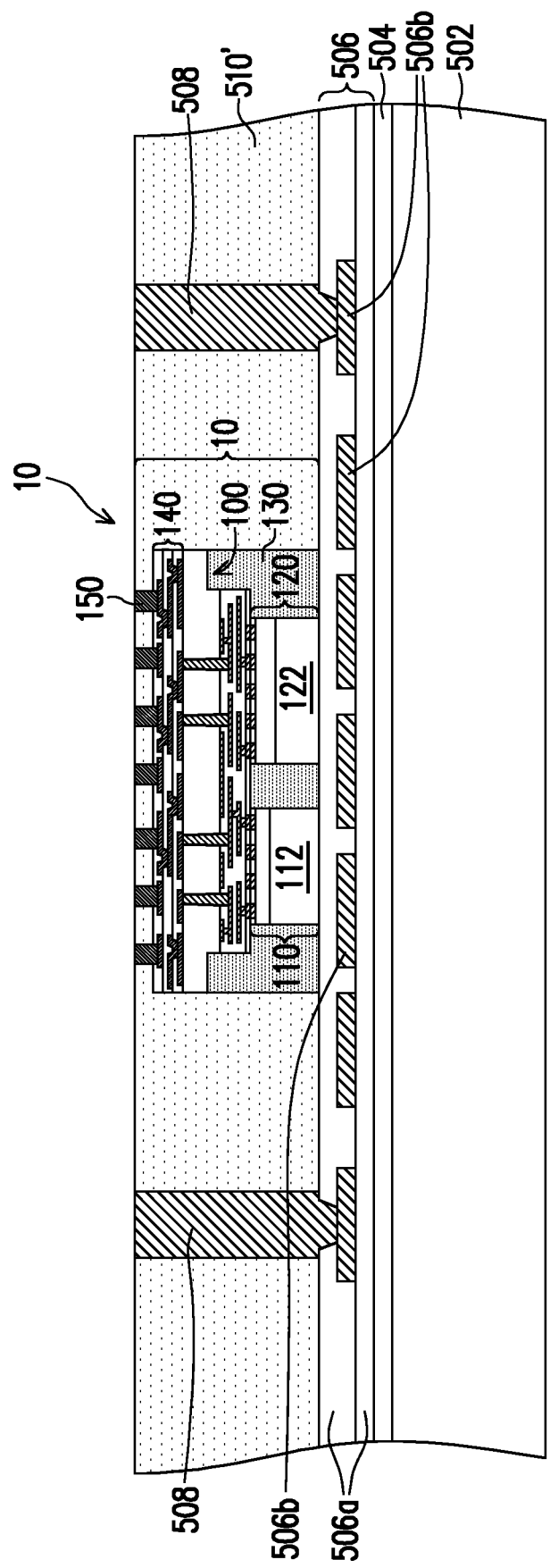

Referring to FIG. 16D, the encapsulant 510 is partially removed to expose the through insulator vias 508, and the conductive terminals 150 of the die stack structure 10. In some embodiments, the encapsulant 510 is ground or polished by a planarization step. For example, the planarization step is performed through a mechanical grinding process and/or a CMP process until the illustrated top surfaces of the conductive terminals 150 are revealed. In some embodiments, the through insulator vias 508 may be partially ground or polished so that the illustrated top surfaces of the through insulator vias 508 are levelled with the illustrated top surfaces of the conductive terminals 150. In some embodiments, the conductive terminals 150 may be slightly ground or polished.

In the illustrated embodiment, the encapsulant 510 is polished to form an encapsulant 510'. In some embodiments, after the planarization step, the illustrated top surfaces of the through insulator vias 508, the illustrated top surfaces of the conductive terminals 150 and the illustrated top surface of the encapsulant 510' are substantially flush or coplanar with one another. In some embodiments, after the planarization step, a cleaning step may be optionally performed. For example, the cleaning step is preformed to clean and remove the residue generated from the planarization step, and the planarization step may be performed through any other suitable methods.

Figure 16E:
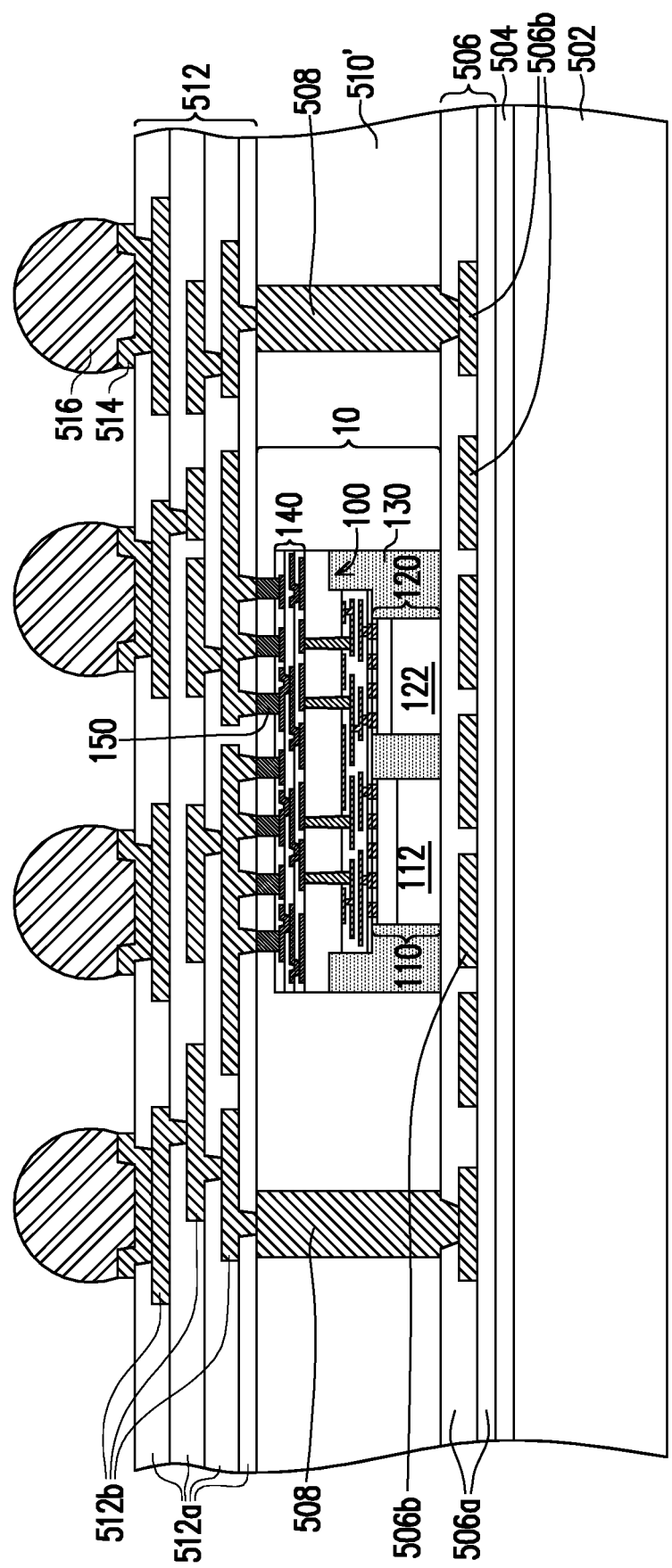

Referring to FIG. 16E, after the planarization step, a redistribution layer 512 is formed on the encapsulant 510', the through insulator vias 508 and on the die stack structure 10. As shown in FIG. 16E, the encapsulant 510' is located between the redistribution layer 512 and the redistribution layer 506. In some embodiments, the redistribution layer 506 may be referred as a back-side redistribution layer, and the redistribution layer 512 may be referred as a front-side redistribution layer. In some embodiments, the redistribution layer 512 is electrically connected with the through insulator vias 508, and is electrically connected with the first die 100, the second die 110 and the third die 120 through the conductive terminals 150. In some embodiments, the first die 100, the second die 110 and the third die 120 are electrically connected with the through insulator vias 508 through the redistribution layer 512.

Furthermore, in some embodiments, the formation of the redistribution layer 512 includes sequentially forming one or more dielectric layers 512a, and one or more conductive layers 512b in alternation. In certain embodiments, the conductive layers 512b are sandwiched between the dielectric layers 512a, but the illustrated top surface of the topmost layer of the conductive layers 512b is exposed by the topmost layer of the dielectric layers 512a to connect the conductive pads 514 (described hereinafter), and the lowest layer of the conductive layers 512b is exposed by the lowest layer of the dielectric layers 512a to connect the through insulator vias 508 and the conductive terminals 150. Although three layers of the conductive layers 512b and four layers of dielectric layers 512a are illustrated herein, the scope of the disclosure is not limited by the embodiments of the disclosure. In other embodiments, the number of the conductive layers 512b and the number of the dielectric layers 512a may be adjusted based on product requirement. In some embodiments, the material of the dielectric layer 512a of the redistribution layer 512 is similar to the material of the dielectric layer 506a mentioned for the redistribution layer 506, and the material of the conductive layer 512b of the redistribution layer 512 is similar to the material of the conductive layer 506b mentioned for the redistribution layer 506. Therefore, the detailed description of the dielectric layer 512a and the conductive layer 512b will be omitted herein.

Continued on FIG. 16E, after forming the redistribution layer 512, a plurality of conductive pads 514 may be disposed on the exposed top surface of the topmost layer of the conductive layers 512b. In certain embodiments, the conductive pads 514 are for example, under-ball metallurgy (UBM) patterns used for ball mount. As shown in FIG. 16E, the conductive pads 514 are formed on and electrically connected with the redistribution layer 512. In some embodiments, the material of the conductive pads 514 may include copper, nickel, titanium, tungsten, or alloys thereof or the like, and may be formed by an electroplating process, for example. The number of conductive pads 514 are not limited in this disclosure, and may be selected based on the design layout. In some alternative embodiments, the conductive pads 514 may be omitted. In other words, conductive terminals 516 formed in subsequent steps may be directly disposed on the redistribution layer 512.

After forming the conductive pads 514, a plurality of conductive terminals 516 may be disposed on the conductive pads 514 and over the redistribution layer 512. In some embodiments, the conductive terminals 516 are attached to the conductive pads 514 through a solder flux (not shown). In some embodiments, the conductive terminals 516 are, for example, solder balls, ball grid array (BGA) balls, or controlled collapse chip connect (C4) bumps. In some embodiments, the conductive terminals 516 are made of a conductive material such as solder, copper, aluminum, gold, nickel, silver, palladium, tin, or a combination thereof. In some embodiments, the conductive terminals 516 may be formed by a suitable process such as evaporation, plating, ball drop, screen printing, a ball mounting process, a reflow process, or a combination thereof. In some embodiments, the conductive terminals 516 are connected to the redistribution layer 512 through the conductive pads 514. In certain embodiments, some of the conductive terminals 516 may be electrically connected to the die stack structure 10 through the redistribution layer 512. Furthermore, some of the conductive terminals 516 may be electrically connected to the through insulator vias 508 through the redistribution layer 512. The number of the conductive terminals 516 is not limited to the disclosure, and may be designated and selected based on the number of the conductive pads 514. The disclosure is not limited thereto.

Figure 16F:
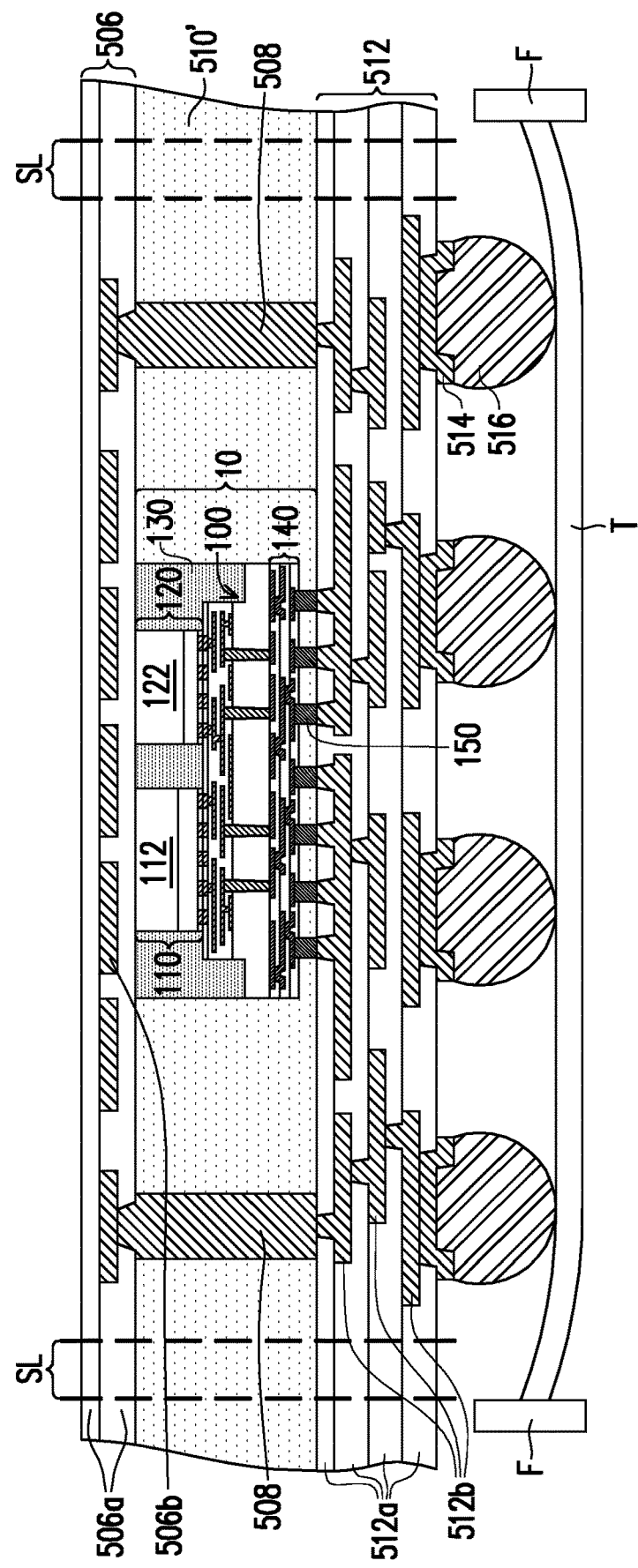

Referring to FIG. 16F, after forming the redistribution layer 512 and placing the conductive terminals 516 thereon, the structure shown in FIG. 16E may be flipped (turned upside down) and attached to a tape T (e.g., a dicing tape) supported by a frame F. As illustrated in FIG. 16F, the carrier 502 is debonded and is separated from the redistribution layer 506. In some embodiments, the de-bonding step includes projecting a light such as a laser light or an UV light on the debond layer 504 (e.g., the LTHC release layer) so that the carrier 502 can be easily removed along with the debond layer 504. During the de-bonding step, the tape T is used to secure the package structure before de-bonding the carrier 502 and the debond layer 504. After the de-bonding step, a backside surface (i.e., the illustrated top surface in FIG. 16F) of the redistribution layer 506 is revealed or exposed.

Figure 16G:
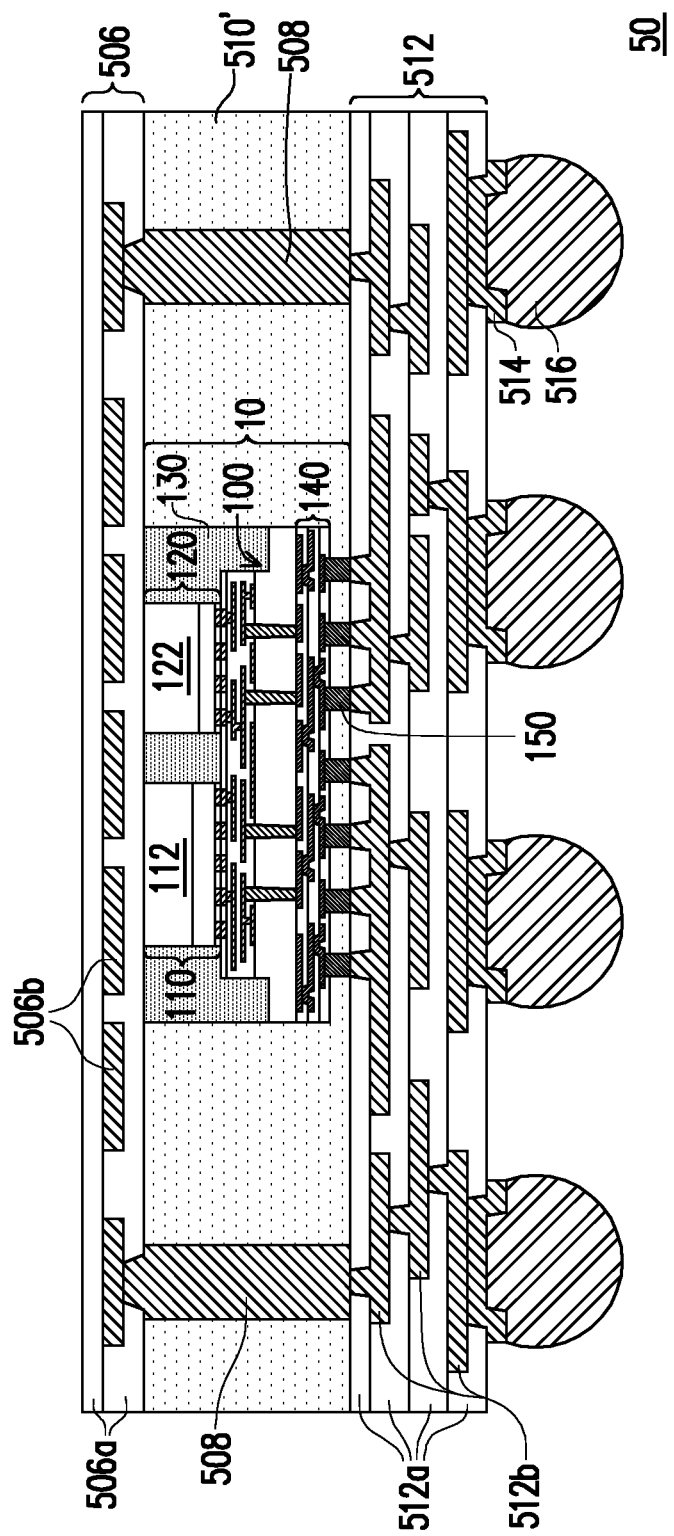

Referring to both FIG. 16F and FIG. 16G, after the de-bonding step, a singulation process is performed along intersected scribe lanes SL to cut the whole wafer structure shown in FIG. 16F (i.e., cutting through the encapsulant 510', the redistribution layers 506 and 512) into a plurality of package structures 50. The package structures 50 are referred to as integrated fan-out (InFO) packages. In the exemplary embodiment, the singulation process is a wafer dicing process including mechanical blade sawing or laser cutting. In a subsequent process, the separated package structures 50 may, for example, be disposed onto a circuit substrate or onto other components based on requirements. As mentioned above, the non-sharp corners of the first die 100 aids releasing stress caused by CTE mismatch. As such, by using the die stack structure 10 in the package structure 50, even stress is induced in the package structure 50 because of CTE mismatch between the encapsulant 130 and the first die 100 and/or between the encapsulant 510 and the first die 100, the crack and/or delamination prone to occur at fragile material in the first die 100 can effectively be suppressed. As a result, the negative effects originated from sharp corners may be sufficiently eliminated, thereby ensuring the performance and efficiency of the subsequently formed device.

Although the package structure 50 includes the die stack structure 10 described in conjunction with FIGS. 1-5, those skilled in the art should understand that the die stack structure 20 described in conjunction with FIGS. 6-8, the die stack structure 30 described in conjunction with FIG. 9 or the die stack structure 40 described in conjunction with FIGS. 10-12 may be used in replacement of the die stack structure 10. Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Figure 17:
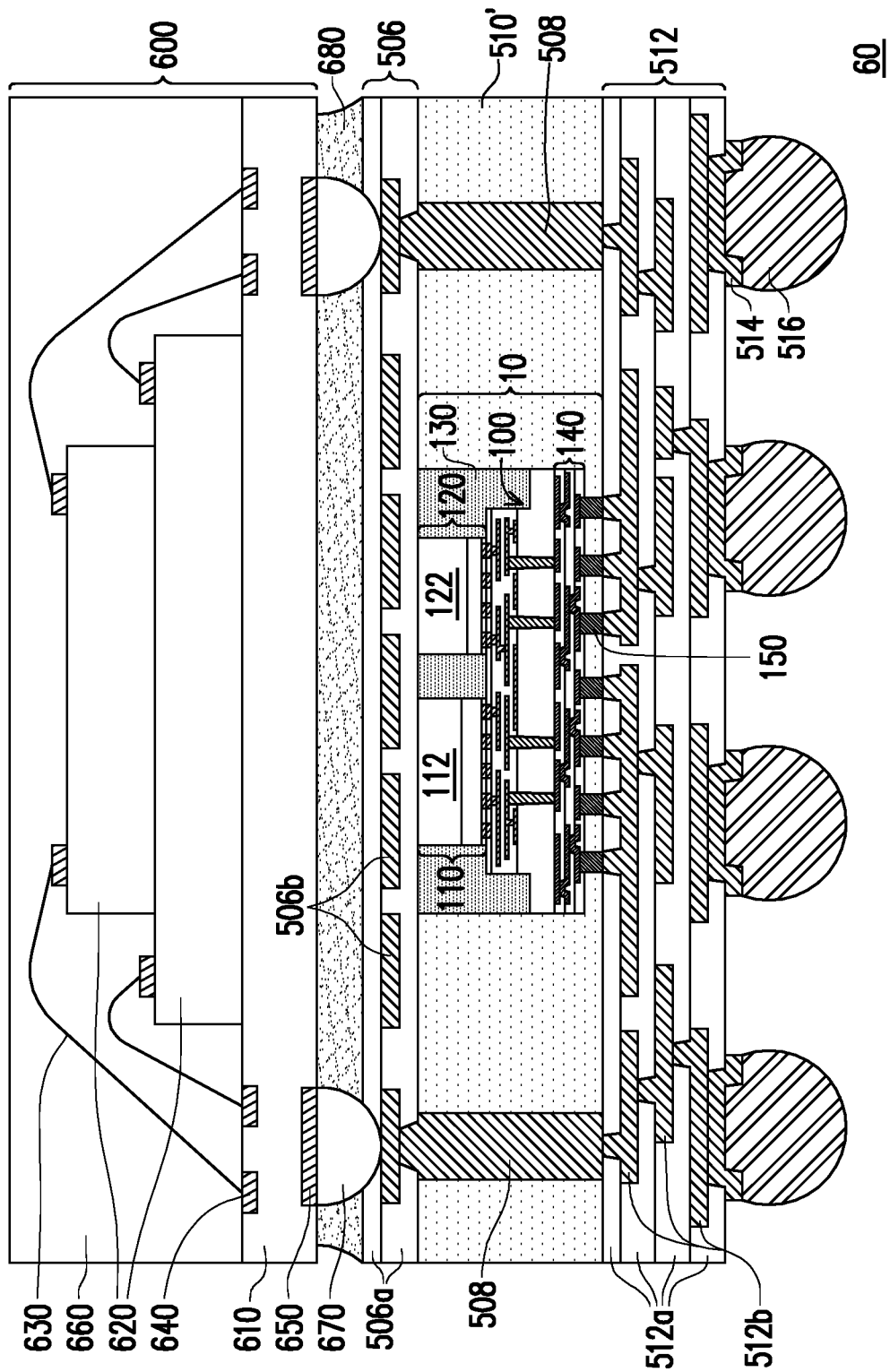
FIG. 17 is a schematic cross-sectional view of a package-on-package (PoP) structure in accordance with some embodiments of the present disclosure.

FIG. 17 is a schematic cross-sectional view of a package-on-package (PoP) structure in accordance with some embodiments of the present disclosure. Referring to FIG. 17, after fabricating a first package, such as the package structure 50 illustrated in FIG. 16G, a second package 600 may be stacked on the package structure 50 (first package) so as to form a package-on-package (PoP) structure 60. As illustrated in FIG. 17, the second package 600 is electrically connected to the conductive layer 506b of the package structure 50 (first package). In some embodiments, the second package 600 has a substrate 610, semiconductor dies 620, bonding wires 630, conductive pads 640, conductive pads 650, and an encapsulant 560. In some embodiments, the semiconductor dies 620 are mounted on the illustrated top surface of the substrate 610 and stacked on top of one another, shown in FIG. 17. In some embodiments, the bonding wires 630 are used to provide electrical connections between the semiconductor dies 620 and the conductive pads 640 (such as bonding pads). In some embodiments, the encapsulant 560 is formed to encapsulate and protect the semiconductor dies 620 and the bonding wires 630. In some embodiments, through insulator vias (not shown) may be used to provide electrical connections between the conductive pads 640 and the conductive pads 650 (such as bonding pads). In some embodiments, the conductive pads 640 and the conductive pads 650 are respectively disposed on two opposite surfaces of the substrate 610, as shown in FIG. 17. In certain embodiments, the conductive pads 650 are electrically connected with the semiconductor dies 620 through the through insulator vias (not shown). In some embodiments, the conductive pads 650 of the package structure 600 are electrically connected with conductive terminals 670. Furthermore, the conductive terminals 670 are electrically connected with the conductive layer 506b of the redistribution layer 506 in the package structure 50 (first package). In some embodiments, an underfill 680 is further provided to fill the gap between the second package 600 on the package structure 50 (first package) to protect the conductive terminals 670. Owing to the underfill 680, a bonding strength between the second package 600 and the package structure 50 (first package) are enhanced, thereby improving the reliability of the package-on-package structure 60.

Figure 18:
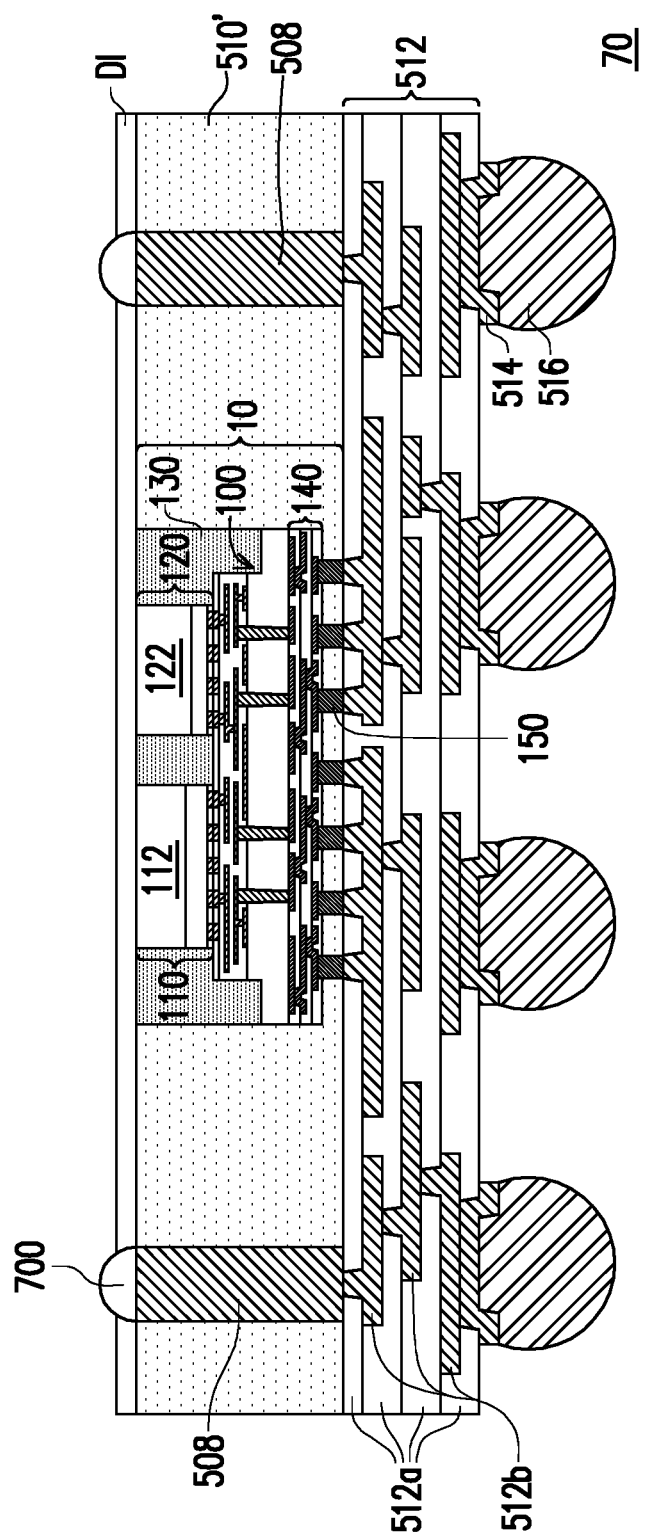
FIG. 18 is a schematic cross-sectional view of a package structure in accordance with some alternative embodiments of the present disclosure.

FIG. 18 is a schematic cross-sectional view of a package structure in accordance with some alternative embodiments of the present disclosure. The package structure 70 illustrated in FIG. 18 is similar to the package structure 50 illustrated in FIG. 16G, hence the same reference numerals are used to refer to the same or liked parts, and its detailed description will be omitted herein. The main difference between the package structure 70 illustrated in FIG. 18 and the package structure 50 illustrated in FIG. 16G lies in that the redistribution layer 506 is omitted from the package structure 70. Referring to FIG. 18, in some embodiments, a dielectric layer DI is formed on the encapsulant 130, the semiconductor substrate 112 of the second die 110 and the semiconductor substrate 122 of the third die 120 in replacement of the redistribution layer 506. In certain embodiments, the dielectric layer DI has openings that reveal the through insulator vias 508, and conductive terminals 700 are disposed in the openings of the dielectric layer DI to connect the through insulator vias 508. In other words, the package structure 70 with dual side terminals is accomplished without the redistribution layer 506. In some alternative embodiments, the conductive terminals 700 may be omitted, and the dielectric layer DI may cover up the backside of the encapsulant 510' and the backside of the die stack structure 10.

In accordance with some embodiments of the disclosure, a die stack structure including a first die, an encapsulant, a redistribution layer and a second die is provided. The encapsulant laterally encapsulates the first die. The redistribution layer is disposed below the encapsulant, and electrically connected with the first die. The second die is disposed between the redistribution layer and the first die, wherein the first and second dies are electrically connected with each other, the second die comprises a body portion having a first side surface, a second side surface and a curved side surface therebetween, and the curved side surface connects the first side surface and the second side surface.

In accordance with some alternative embodiments of the disclosure, a die stack structure including a first die, an encapsulant, a redistribution layer and a second die is provided. The encapsulant laterally encapsulates the first die. The redistribution layer is disposed below the encapsulant, and electrically connected with the first die. The second die is disposed between the redistribution layer and the first die, wherein the first and second dies are electrically connected with each other, the second die comprises a body portion having a first side surface, a second side surface and a third side surface, the second side surface located between the first and third side surfaces connects the first side surface and the third side surface, a first obtuse angle is included between the first side surface and the second side surface, and a second obtuse angle is included between the second side surface and the third side surface.

In accordance with some alternative embodiments of the disclosure, a method of manufacturing a die stack structure including the following steps is provided. A semiconductor wafer having first dies is provided. A trench forming process is performed on the first dies of the semiconductor wafer, wherein the trench forming process comprises the following steps of providing a mask with openings, and performing an anisotropic etching with the mask to form ring-shaped trenches in the first dies of the semiconductor wafer corresponding to the openings. Seconds dies are bonded onto the first dies of the semiconductor wafer. The second dies are encapsulated by an encapsulant to form a molded wafer. A redistribution layer is formed on the molded wafer. A singulation process is performed to the molded wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A die stack structure, comprising:
   a first die;
   an encapsulant laterally encapsulating the first die;
   a redistribution layer, disposed below the encapsulant and electrically connected with the first die;
   a second die, disposed between the redistribution layer and the first die, wherein the first and second dies are electrically connected with each other,
   wherein the second die comprises a body portion having a first side surface, a second side surface and a curved side surface therebetween, and the curved side surface connects the first side surface and the second side surface, and the second die comprises a flange portion surrounding the body portion, wherein the flange portion has an outer profile vertically aligned with an outer profile of the encapsulant.

2. The die stack structure according to claim 1, wherein the encapsulant further covers the second die and contacts the curved side surface of the second die.

3. The die stack structure according to claim 1, wherein the body portion comprises a semiconductor substrate and an interconnect structure disposed on the semiconductor substrate, and a material of the flange portion is the same as a material of the semiconductor substrate of the body portion.

4. The die stack structure according to claim 3, wherein a top surface of the flange portion is lower than a top surface of the semiconductor substrate of the body portion.

5. The die stack structure according to claim 3, wherein a top surface of the flange portion is substantially coplanar with a top surface of the semiconductor substrate of the body portion.

6. The die stack structure according to claim 1, wherein the encapsulant is in physical contact with the redistribution layer.

7. The die stack structure according to claim 1, wherein an outer profile of the encapsulant is vertically aligned with an outer profile of the body portion, and an outer profile of the redistribution layer is vertically aligned with an outer profile of the body portion.

8. A die stack structure, comprising:
   a first die;
   an encapsulant laterally encapsulating the first die;
   a redistribution layer, disposed below the encapsulant and electrically connected with the first die;
   a second die, disposed between the redistribution layer and the first die, wherein the first and second dies are electrically connected with each other,
   wherein the second die comprises a body portion having a first side surface, a second side surface and a third side surface, the second side surface located between the first and third side surfaces connects the first side surface and the third side surface, a first obtuse angle is included between the first side surface and the second side surface, and a second obtuse angle is included between the second side surface and the third side surface, and the second die comprises a flange portion surrounding the body portion, wherein the flange portion has an outer profile vertically aligned with an outer profile of the encapsulant.

9. The die stack structure according to claim 8, wherein the encapsulant further covers the second die and contacts the second side surface of the second die.

10. The die stack structure according to claim 8, wherein the body portion comprises a semiconductor substrate and an interconnect structure disposed on the semiconductor substrate, and a material of the flange portion is the same as a material of the semiconductor substrate of the body portion.

11. The die stack structure according to claim 10, wherein a top surface of the flange portion is substantially coplanar with a top surface of the semiconductor substrate of the body portion.

12. The die stack structure according to claim 10, wherein a top surface of the flange portion is lower than a top surface of the semiconductor substrate of the body portion.

13. The die stack structure according to claim 8, wherein the encapsulant is in physical contact with the redistribution layer.

14. The die stack structure according to claim 8, wherein an outer profile of the encapsulant is vertically aligned with an outer profile of the body portion, and an outer profile of the redistribution layer is vertically aligned with an outer profile of the body portion.

15. A method of manufacturing a die stack structure, comprising:
   providing a semiconductor wafer having first dies;
   performing a trench forming process on the first dies of the semiconductor wafer, the trench forming process comprising:
      providing a mask with openings; and
      performing an anisotropic etching with the mask to form ring-shaped trenches in the first dies of the semiconductor wafer corresponding to the openings, wherein each of the first dies of the semiconductor wafer comprises a flange portion located right under the corresponding ring-shaped trench and a body portion laterally surrounded by the corresponding ring-shaped trench and the flange portion;
   bonding seconds dies onto the first dies of the semiconductor wafer;
   encapsulating the second dies by an encapsulant to form a molded wafer;
   forming a redistribution layer on the molded wafer; and
   performing a singulation process to the molded wafer, wherein the flange portion has an outer profile vertically aligned with an outer profile of the encapsulant.

16. The method according to claim 15, wherein at least one of the ring-shaped trenches has a first sidewall, a second sidewall and a curved sidewall located therebetween, and the curved sidewall connects the first sidewall and the second sidewall.

17. The method according to claim 15, wherein at least one of the ring-shaped trenches has a first sidewall, a second sidewall and a third sidewall, the second sidewall located between the first sidewall and the third sidewall connects the first sidewall and the third sidewall, a first obtuse angle is included between the first sidewall and the second sidewall, and a second obtuse angle is included between the second sidewall and the third sidewall.

18. The method according to claim 15, wherein at least one of the first dies comprises a semiconductor substrate and an interconnect structure disposed on the semiconductor substrate, and the trench forming process etches through the interconnect structures of the first dies to form the ring-shaped trenches.

19. The method according to claim 18, wherein the trench forming process etches through the interconnect structures of the first dies and etches into the semiconductor substrates of the first dies to form the ring-shaped trenches.

20. The method according to claim 15, wherein the encapsulant fills into the ring-shaped trench.

* * * * *